United States Patent
Sasaki et al.

(10) Patent No.: US 8,105,926 B2
(45) Date of Patent: Jan. 31, 2012

(54) METHOD FOR PRODUCING A SEMICONDUCTOR DEVICE BY PLASMA DOPING A SEMICONDUCTOR REGION TO FORM AN IMPURITY REGION

(75) Inventors: Yuichiro Sasaki, Osaka (JP); Katsumi Okashita, Osaka (JP); Keiichi Nakamoto, Osaka (JP); Hiroyuki Ito, Chiba (JP); Bunji Mizuno, Nara (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/853,840

(22) Filed: Aug. 10, 2010

(65) Prior Publication Data

US 2010/0330782 A1 Dec. 30, 2010

Related U.S. Application Data

(60) Division of application No. 12/025,504, filed on Feb. 4, 2008, now Pat. No. 7,800,165, which is a continuation of application No. PCT/JP2008/50253, filed on Jan. 11, 2008.

(30) Foreign Application Priority Data

Jan. 22, 2007 (JP) .................. 2007-011572

(51) Int. Cl.
*H01L 21/425* (2006.01)
(52) U.S. Cl. ........ 438/513; 438/515; 438/517; 438/529; 257/E21.473
(58) Field of Classification Search .............. 438/513
See application file for complete search history.

(56) References Cited

U.S. PATENT DOCUMENTS

| | | | |
|---|---|---|---|
| 6,031,249 A | 2/2000 | Yamazaki et al. | |
| 6,970,373 B2 | 11/2005 | Datta et al. | |
| 7,023,021 B2 | 4/2006 | Yamazaki et al. | |
| 7,074,656 B2 | 7/2006 | Yeo et al. | |
| 7,238,601 B2 | 7/2007 | Matthew et al. | |
| 7,879,701 B2 * | 2/2011 | Koezuka et al. | 438/514 |
| 2003/0197179 A1 * | 10/2003 | Yamazaki et al. | 257/59 |
| 2006/0057792 A1 | 3/2006 | Mathew et al. | |
| 2007/0007524 A1 | 1/2007 | You et al. | |

(Continued)

FOREIGN PATENT DOCUMENTS

CN 1314715 A 9/2001

(Continued)

OTHER PUBLICATIONS

Lenoble D., et al., "Enhanced performance of PMOS MUGFET via integration of conformal plasma-doped source/drain extensions," 2006 Symposium on VLSI Technology Digest of Technical Papers, 2 pages.

(Continued)

*Primary Examiner* — Stephen W Smoot
(74) *Attorney, Agent, or Firm* — McDermott Will & Emery LLP

(57) ABSTRACT

A semiconductor region having an upper surface and a side surface is formed on a substrate. A first impurity region is formed in an upper portion of the semiconductor region. A second impurity region is formed in a side portion of the semiconductor region. The resistivity of the second impurity region is substantially equal to or smaller than that of the first impurity region.

12 Claims, 13 Drawing Sheets

U.S. PATENT DOCUMENTS

| | | |
|---|---|---|
| 2008/0308871 A1 | 12/2008 | Sasaki et al. |
| 2009/0026540 A1 | 1/2009 | Sasaki et al. |

FOREIGN PATENT DOCUMENTS

| | | |
|---|---|---|
| CN | 1542930 A | 11/2004 |
| CN | 1890798 A | 1/2007 |
| JP | 10-79517 | 3/1998 |
| JP | 2006-164997 | 6/2006 |
| JP | 2006-196821 | 7/2006 |
| JP | 2007-13145 | 1/2007 |
| WO | WO 2006/064772 A1 | 6/2006 |

OTHER PUBLICATIONS

International Search Report issued in International Patent Application No. PCT/JP2008/050253, dated Apr. 1, 2008.

United States Office Action issued in U.S. Appl. No. 12/168,686 dated Mar. 24, 2010.

Chinese Office Action issued in Chinese Patent Application No. CN 200880002383.9 dated Jul. 16, 2010.

\* cited by examiner

METHOD FOR PRODUCING A SEMICONDUCTOR DEVICE BY PLASMA DOPING A SEMICONDUCTOR REGION TO FORM AN IMPURITY REGION

CROSS REFERENCE TO RELATED APPLICATIONS

This application is a Divisional of U.S. patent application Ser. No. 12/025,504, filed on Feb. 4, 2008, now U.S. Pat. No. 7,800,165, which is a continuation of International Application PCT/JP2008/50253, filed on Jan. 11, 2008, claiming priority of Japanese Patent Application No. 2007-011572, filed on Jan. 22, 2007, the entire contents of each of which are hereby incorporated by reference.

FIELD OF THE INVENTION

The present invention relates to a semiconductor device and a method for producing the same, and more particularly to a semiconductor device of a three-dimensional structure including fin-shaped semiconductor regions on a substrate and a method for producing the same.

BACKGROUND ART

In recent years, demands for miniaturizing semiconductor devices have been increasing along with the increase in the degree of integration, functionality and speed thereof. In view of this, various device structures have been proposed in the art, aiming at the reduction in the area of the substrate taken up by transistors. Among others, attention has been drawn to field effect transistors having a fin-shaped structure. A field effect transistors having the fin-shaped structure is commonly called a fin-shaped FET (field effect transistor), and has an active region including thin wall (fin)-like semiconductor regions perpendicular to the principle plane of the substrate. In a fin-shaped FET, the side surface of the semiconductor region can be used as a channel surface, whereby it is possible to reduce the area on the substrate taken up by the transistor (see, for example, Patent Document 1 and Non-Patent Document 1).

FIG. 16A to FIG. 16D show a structure of a conventional fin-shaped FET, wherein FIG. 16A is a plan view of the device, FIG. 16B is a cross-sectional view taken along line A-A in FIG. 16A, FIG. 16C is a cross-sectional view taken along line B-B in FIG. 16A, and FIG. 16D is a cross-sectional view taken along line C-C in FIG. 16A.

As shown in FIG. 16A to FIG. 16D, a conventional fin-shaped FET includes a supporting substrate 101 made of silicon, an insulating layer 102 made of silicon oxide formed on the supporting substrate 101, semiconductor regions 103a to 103d each formed into a fin shape on the insulating layer 102 (hereinafter referred to as the "fin-shaped semiconductor regions"), a gate electrode 105 formed on the fin-shaped semiconductor regions 103a to 103d via gate insulating films 104a to 104d, insulative sidewall spacers 106 formed on side surfaces of the gate electrode 105, extension regions 107 formed on opposite side regions of the fin-shaped semiconductor regions 103a to 103d sandwiching the gate electrode 105 therebetween, and source-drain regions 117 formed on opposite side regions of the fin-shaped semiconductor regions 103a to 103d sandwiching the gate electrode 105 and the insulative sidewall spacer 106 therebetween. The fin-shaped semiconductor regions 103a to 103d are placed on the insulating layer 102 so as to be arranged at regular intervals in the gate width direction. The gate electrode 105 is formed so as to extend across the fin-shaped semiconductor regions 103a to 103d in the gate width direction. The extension region 107 includes a first impurity region 107a formed in an upper portion of each of the fin-shaped semiconductor regions 103a to 103d, and a second impurity region 107b formed in a side portion of each of the fin-shaped semiconductor regions 103a to 103d. The source-drain region 117 includes a third impurity region 117a formed in an upper portion of each of the fin-shaped semiconductor regions 103a to 103d, and a fourth impurity region 117b formed in a side portion of each of the fin-shaped semiconductor regions 103a to 103d. Note that pocket regions are not described herein or shown in the figure.

FIG. 17A to FIG. 17D are cross-sectional views, showing, step by step, a conventional method for producing a semiconductor device. Note that FIG. 17A to FIG. 17D correspond to the cross-sectional structure taken along line C-C in FIG. 16A. In FIG. 17A to FIG. 17D, like elements to those shown in FIG. 16A to FIG. 16D are denoted by like reference numerals and will not be described again.

First, as shown in FIG. 17A, there is provided an SOI (silicon on insulator) substrate, in which the insulating layer 102 made of silicon oxide is provided on the supporting substrate 101 made of silicon, and a semiconductor layer made of silicon is provided on the insulating layer 102. Then, the semiconductor layer is patterned to form the fin-shaped semiconductor region 103b to be the active region.

Then, as shown in FIG. 17B, the gate insulating film 104 is formed on the surface of the fin-shaped semiconductor region 103b, after which a polysilicon film 105A is formed across the entire surface of the supporting substrate 102. Then, as shown in FIG. 17C, the polysilicon film 105A and the gate insulating film 104 are etched successively to form the gate electrode 105 on the fin-shaped semiconductor region 103b with the gate insulating film 104b interposed therebetween. Then, using the gate electrode 105 as a mask, the semiconductor region 103b is ion-implanted with an impurity to form the extension region 107 and the pocket region (not shown).

Next, as shown in FIG. 17D, an insulating film is formed across the entire surface of the supporting substrate 102, and then the insulating film is etched back by using anisotropic dry etching to thereby form the insulative sidewall spacer 106 on the side surface of the gate electrode 105. Then, using the gate electrode 105 and the side wall 106 as a mask, the semiconductor region 103b is ion-implanted with an impurity to form the source-drain region 117.

Through the steps described above, it is possible to obtain a fin-shaped MISFET (metal insulator semiconductor field effect transistor) having the gate electrode 105 formed on the fin-shaped semiconductor region 103b with the gate insulating film 104b interposed therebetween.

[Patent Document 1] Japanese Laid-Open Patent Publication No. 2006-196821

[Non-Patent Document 1] D. Lenoble, et al., Enhanced performance of PMOS MUGFET via integration of conformal plasma-doped source/drain extensions, 2006 Symposium on VLSI Technology Digest of Technical Papers, p. 212

DISCLOSURE OF THE INVENTION

Problems to Be Solved by the Invention

However, with conventional methods for producing a semiconductor device disclosed in documents such as Patent Document 1 and Non-Patent Document 1 identified above, it is not possible to obtain desirable transistor characteristics In view of this, it is an object of the present invention to realize a semiconductor device including fin-shaped semiconductor regions with which desirable characteristics can be obtained (e.g., a device which does not exhibit a substantial reduction in drain current).

Means for Solving the Problems

In order to achieve the object set forth above, the present inventors have studied the reason why desirable transistor characteristics cannot be obtained with the conventional methods for producing a fin-shaped FET, which lead to the following findings.

FIG. 18A is a cross-sectional view of an important part showing the step of forming an extension region of a fin-shaped FET as described in Patent Document 1, and FIG. 18B is a cross-sectional view showing the step of forming an extension region of a fin-shaped FET as described in Non-Patent Document 1. Note that FIG. 18A and FIG. 18B correspond to the cross-sectional structure (before the formation of the insulative sidewall spacer 106) taken along line B-B in FIG. 16A. In FIGS. 18A and 18B, like elements to those shown in FIG. 16A to FIG. 16D are denoted by like reference numerals.

As shown in FIG. 18A, in the method disclosed in Patent Document 1, in order to introduce an impurity not only into the upper surface of the fin-shaped semiconductor regions 103a to 103d but also into the side surface thereof, ions 108a and 108b are implanted by ion implantation into the fin-shaped semiconductor regions 103a to 103d at respective implantation angles inclined with respect to the vertical direction in different directions from each other, thus forming the extension region 107. In such a case, the first impurity region 107a, into which the ions 108a and the ions 108b are both implanted, is formed in the upper portion of the fin-shaped semiconductor regions 103a to 103d. However, the second impurity region 107b, into which either the ions 108a or the ions 108b are implanted, is formed in each side portion of the fin-shaped semiconductor regions 103a to 103d. Thus, where the dose of the ions 108a and that of the ions 108b are equal to each other, the implantation dose of the first impurity region 107a is twice as large as the implantation dose of the second impurity region 107b.

As shown in FIG. 18B, in the method disclosed in Non-Patent Document 1, the extension region 107 is formed in the fin-shaped semiconductor regions 103a to 103d by using a plasma doping method. Where an impurity is implanted by using a plasma doping method, the first impurity region 107a is formed in an upper portion of the fin-shaped semiconductor regions 103a to 103d, wherein the implantation dose of the first impurity region 107a is dictated by the balance between implanted ions 109a, an adsorbed species (a neutral species such as gas molecules or radicals) 109b, and an impurity 109c that is desorbed from the fin-shaped semiconductor regions 103a to 103d by sputtering. However, the implantation dose of each side portion of the fin-shaped semiconductor regions 103a to 103d is less influenced by the implanted ions 109a and the impurity 109c desorbed by sputtering, and there is formed the second impurity region 107b whose implantation dose is mainly dictated by the adsorbed species 109b. As a result, the implantation dose of the first impurity region 107a is higher than that of the second impurity region 107b by about 25%, for example.

As described above, with the conventional methods for forming an extension region of a fin-shaped FET, the implantation dose of the first impurity region 107a formed in an upper portion of the fin-shaped semiconductor regions 103a to 103d is higher than that of the second impurity region 107b formed in a side portion of the fin-shaped semiconductor regions 103a to 103d. Moreover, the junction depth of the second impurity region 107b is shallower than that of the first impurity region 107a. Accordingly, the sheet resistance, the resistivity, or the spreading resistance of the first impurity region 107a is lower than the sheet resistance, the resistivity, or the spreading resistance of the second impurity region 107b. Wherein, $Rs=\rho/t$ is satisfied where Rs is a sheet resistance of a target, $\rho$ is a specific resistance (resistivity), t is a thickness (junction depth), and pw is a spreading resistance. Further, as expressed by the relational expression, $\rho w = CF \cdot k \cdot \rho / 2\pi r$, which is widely known in the art of spreading resistance measurement, proportion of Rs to $\rho w/t$ is lead (i.e., main component) since the specific resistance (resistivity) $\rho$ and the spreading resistance $\rho w$ are basically in one to one correspondence. In the relational expression, CF is a correction factor with the volume effect of the spreading resistance $\rho\rho w$ taken into consideration (wherein, with no correction, CF is 1), k is a correction factor with the polarity dependency in Schottky barrier between a probe and a sample taken into consideration (for example, k is 1 when a sample is made of p-type silicon, or k is any of 1 to 3 when a sample is made of n-type silicon), and r is a radius of curvature of the tip end of a probe.

When a fin-shaped FET having such an extension structure is operated, the current flowing through the extension region 107 is localized in the first impurity region 107a where the implantation dose is higher, i.e., the sheet resistance is lower, than the second impurity region 107b, thereby failing to obtain desirable transistor characteristics.

Moreover, in the conventional fin-shaped FET, the source-drain region is also formed by using an ion implantation method or a plasma doping method similar to that for the extension region. Therefore, also in the source-drain region 117, the implantation dose of the third impurity region 117a formed in an upper portion of the fin-shaped semiconductor regions 103a to 103d is higher than that of the fourth impurity region 117b formed in a side portion of the fin-shaped semiconductor regions 103a to 103d. Moreover, the junction depth of the fourth impurity region 117b is shallower than that of the third impurity region 117a. When a fin-shaped FET having such a source-drain structure is operated, the current flowing through the source-drain region 117 is localized in the third impurity region 117a where the implantation dose is higher, i.e., the sheet resistance is lower, than the fourth impurity region 117b, thereby failing to obtain desirable transistor characteristics.

Based on the above findings, the present inventors have invented a semiconductor device including an impurity region in a side portion of a fin-shaped semiconductor region where the implantation dose is substantially equal to or greater than that in an upper portion of the fin-shaped semiconductor region, and a method for producing the same. Particularly, in some cases with a fin-shaped FET, the width of the impurity region formed in a side portion of the fin-shaped semiconductor region accounts for 70% or more of the width of the extension region and the source-drain region in the gate width direction. Therefore, it has become important that the implantation dose of the impurity region formed in a side portion of the fin-shaped semiconductor region is made substantially equal to or greater than that of the impurity region formed in an upper portion of the fin-shaped semiconductor region. In other words, it is important to set the resistivity, the spreading resistance, or the sheet resistance of the impurity region formed in the side portion of the fin-shaped semiconductor region to be equal to or smaller than the resistivity, the spreading resistance, or the sheet resistance of the impurity region formed in the upper portion of the fin-shaped semiconductor region.

Specifically, a first semiconductor device of the present invention is a semiconductor device, including: a first semiconductor region formed on a supporting substrate and having an upper surface and a side surface; a first impurity region of a first conductivity type formed in an upper portion of the first semiconductor region; and a second impurity region of a first conductivity type formed in a side portion of the first semiconductor region, wherein a resistivity of the second impurity region is substantially equal to or smaller than that of the first impurity region.

Note that the transistor characteristics can be significantly improved over the conventional techniques if the implantation dose of the second impurity region formed in a side portion of the first semiconductor region having an upper surface and a side surface, i.e., the fin-shaped semiconductor region, is about 80% (more preferably 90%) or more of that of the first impurity region formed in an upper portion of the fin-shaped semiconductor region.

If "the height of the side surface of the fin-shaped semiconductor region"/"the width of the upper surface of the fin-shaped semiconductor region in the gate width direction" (hereinafter referred to as the "aspect ratio") is small, there will be little degradation in the transistor characteristics even if the implantation dose of the second impurity region is somewhat smaller than that of the first impurity region. An increase in the aspect ratio accordingly increases the necessity to make the implantation dose of the second impurity region to be substantially equal to or greater than that of the first impurity region.

In the first semiconductor device of the present invention, the junction depth of the second impurity region may be substantially equal to or greater than that of the first impurity region.

In the first semiconductor device of the present invention, the first semiconductor region may have a fin shape.

In the first semiconductor device of the present invention, the first semiconductor region may be formed on an insulating layer formed on the supporting substrate.

If the first semiconductor device of the present invention further includes: a gate insulating film formed at least on a side surface of the first semiconductor region in a predetermined portion of the first semiconductor region; and a gate electrode formed on the gate insulating film, wherein the first impurity region and the second impurity region are formed in another portion of the first semiconductor region other than the predetermined portion, it is possible to form a fin-shaped FET. In such a case, the gate insulating film may also be formed on an upper surface of the first semiconductor region in the predetermined portion of the first semiconductor region. The first impurity region and the second impurity region may be a P-type extension region. The semiconductor device may further include: an insulative sidewall spacer formed on a side surface of the gate electrode; a third impurity region of a first conductivity type formed in an upper portion of the first semiconductor region; and a fourth impurity region of a first conductivity type formed in a side portion of the first semiconductor region, wherein: the third impurity region and the fourth impurity region may be formed in a portion of the first semiconductor region which is located outside of the insulative sidewall spacer and is provided in the other portion of the first semiconductor region; and a resistivity of the fourth impurity region may be substantially equal to or smaller than that of the third impurity region. Then, the third impurity region and the fourth impurity region may be a P-type source-drain region. Alternatively, the semiconductor device may further include an insulative sidewall spacer formed on a side surface of the gate electrode, wherein the first impurity region and the second impurity region are formed in a portion of the first semiconductor region which is located outside of the insulative sidewall spacer and is provided in the other portion of the first semiconductor region. Then, the first impurity region and the second impurity region may be a P-type source-drain region. In these cases, if the height of the side surface of the first semiconductor region is greater than the width of the upper surface of the first semiconductor region in the gate width direction, the effects of the present invention are pronounced.

A second semiconductor device of the present invention includes: a plurality of semiconductor regions formed on a supporting substrate and each having an upper surface and a side surface; a first impurity region of a first conductivity type formed in an upper portion of each of the plurality of semiconductor regions; and a second impurity region of a first conductivity type formed in a side portion of each of the plurality of semiconductor regions, wherein a resistivity of the second impurity region is substantially equal to or smaller than that of the first impurity region.

If the second semiconductor device of the present invention further includes a gate electrode formed on each of the plurality of semiconductor regions with a gate insulating film interposed therebetween, wherein the gate electrode extends across the plurality of semiconductor regions in a gate width direction, it is possible to form a fin-shaped FET. Then, the first impurity region and the second impurity region may be a P-type extension region or a P-type source-drain region.

The second semiconductor device of the present invention may further include a third semiconductor region connecting together end portions of the plurality of semiconductor regions on each side of the semiconductor regions in a gate length direction.

The present invention also relates to a method for producing the first or second semiconductor device discussed above. The method includes: a step (a) of forming on a supporting substrate a first semiconductor region having an upper surface and a side surface; and a step (b) of implanting the first semiconductor region with an impurity of a first conductivity type by a plasma doping method to thereby form a first impurity region in an upper portion of the first semiconductor region and a second impurity region in a side portion of the first semiconductor region, wherein in the step (b), a plasma doping method is carried out under a first condition such that an implantation dose is equal to a first dose, and then a plasma doping method is carried out under a second condition such that the implantation dose is equal to a second dose smaller than the first dose.

Thus, the method for producing a semiconductor device of the present invention is characterized in the control of the implantation dose using a plasma doping method, and it is possible to control the sheet resistance to a desirable value through the control of the implantation dose by annealing after doping.

Specifically, in plasma doping, as a material gas is supplied into a plasma, there will be radicals, ions or constituent molecules of the material gas or molecules or atoms resulting from the decomposition of the molecules in the plasma. The present invention focuses on the following inherent properties (1)-(3) of the ions, gas molecules, radicals, etc.:

(1) ions in a plasma are basically incident on the substrate vertically with respect to the principle plane of the substrate;

(2) neutral species such as gas molecules, radicals, etc., in a plasma are incident on the substrate in random directions with respect to the principle plane of the substrate; and (3) there is substantially no influence of an impurity desorbed by sputtering on the side surface of the semiconductor region.

In addition to the properties (1)-(3), the present inventors have newly found the following property characteristic of plasma doping using different conditions:

(4) the level of the implantation dose, i.e., the sheet resistance, which is determined as the influence of doping and the influence of sputtering come to an equilibrium on the semiconductor region upper surface when plasma doping is performed using different conditions, depends only on the plasma doping conditions at the final stage but not on conditions at intermediate stages.

The present invention also relates to a method for applying this to a three-dimensional device such as a fin-shaped FET, and one primary characteristic of the present invention is that "after a plasma doping method is carried out under a first condition such that the implantation dose is equal to a first dose, a plasma doping method is carried out under a second condition such that the implantation dose is equal to a second dose smaller than the first dose". Thus, while the implantation dose of the upper portion of the semiconductor region is basically defined by the low-dose second condition, the implantation dose of the side portion of the semiconductor region is basically defined by the high-dose first condition. Therefore, it is possible to obtain a semiconductor device including, in a side portion of the semiconductor region, an impurity region whose implantation dose is substantially equal to or greater than that in an upper portion of the semiconductor region. In other words, it is possible to obtain a semiconductor device including a low-sheet resistance impurity region in a side portion of the semiconductor region. Therefore, it is possible to obtain desirable transistor characteristics even if the proportion of the width of the impurity region formed in the side portion of the fin-shaped semiconductor region increases with respect to the width in the gate width direction of the extension region and the source-drain region of a fin-shaped FET, for example.

In the method for producing a semiconductor device of the present invention, if the step (b) is performed by using a plasma generated from a gas containing the impurity; and a concentration of the gas under the first condition is higher than that of the gas under the second condition, it is possible to reliably make the implantation dose under the second condition to be smaller than that under the first condition.

In the method for producing a semiconductor device of the present invention, if after the step (b), an implantation dose of the second impurity region is substantially equal to or greater than an implantation dose of the first impurity region, it is possible to reliably obtain the effects as set forth above.

The method for producing a semiconductor device of the present invention may further include, before the step (a), a step of forming an insulating layer on the supporting substrate, wherein the first semiconductor region is formed on the insulating layer in the step (a).

In the method for producing a semiconductor device of the present invention, the side surface of the first semiconductor region may be a surface perpendicular to the upper surface of the first semiconductor region.

In the method for producing a semiconductor device of the present invention, in the first impurity region, an implantation dose at a point in time when the plasma doping method is carried out under the second condition may be decreased from that at a point in time when the plasma doping method is carried out under the first condition.

In the method for producing a semiconductor device of the present invention, the step (b) may be performed by using a plasma generated from a gas containing the impurity; and the gas containing the impurity may contain molecules $B_m H_n$ (m and n are natural numbers) composed of boron atoms and hydrogen atoms.

In the method for producing a semiconductor device of the present invention, the step (b) may be performed by using a plasma generated from a gas containing the impurity; and the gas containing the impurity may be a gas obtained by diluting molecules including boron atoms with a rare gas.

In the method for producing a semiconductor device of the present invention, the step (b) may be performed by using a plasma generated from a gas containing the impurity; and a gas containing the impurity may be a gas obtained by diluting molecules including the impurity with helium.

In the method for producing a semiconductor device of the present invention, the step (b) may be performed by using a plasma generated from a gas containing the impurity; and the gas containing the impurity may be a mixed gas of $B_2H_6$ and He. In such a case, if a concentration by mass of $B_2H_6$ in the mixed gas is greater than or equal to 0.01% and less than or equal to 1%, it is possible to easily introduce boron into the first semiconductor region. If the $B_2H_6$ gas concentration is less than 0.01%, it is difficult to introduce a sufficient amount of boron, and if the $B_2H_6$ gas concentration is greater than 1%, a boron-containing deposit is likely to deposit on the substrate surface.

In the method for producing a semiconductor device of the present invention, the step (b) may be performed by using a plasma generated from a gas containing the impurity; and the gas containing the impurity may contain $BF_3$, $AsH_3$ or $PH_3$.

The method for producing a semiconductor device of the present invention may further include, before the step (b), a step of implanting a semiconductor region which is similar to the first semiconductor region and is provided in each of a plurality of dummy substrates with the impurity by a plasma doping method under various conditions, so as to identify, as the first condition, a condition under which a sheet resistance of an impurity region formed in a side portion of the semiconductor region takes an intended value, and so as to identify, as the second condition, a condition under which a sheet resistance of an impurity region formed in an upper portion of the semiconductor region takes an intended value.

Another method for producing a semiconductor device of the present invention includes a step of implanting a semiconductor region with an impurity of a first conductivity type by a plasma doping method to thereby form an impurity region in the semiconductor region, wherein the step of forming the impurity region comprises a step (a) of carrying out the plasma doping method under a first condition such that an implantation dose is equal to a first dose, and after the step (a), a step (b) of carrying out the plasma doping method under a second condition such that the implantation dose is equal to a second dose smaller than the first dose.

With the other method for producing a semiconductor device of the present invention, an impurity region having a second dose is formed by carrying out the plasma doping method under the second condition such that the implantation dose is equal to the second dose smaller than the first dose after carrying out the plasma doping method under the first condition such that the implantation dose is equal to the first dose. As compared with a case where the impurity region is formed by carrying out the plasma doping method with only the second condition such that the second dose is achieved, it is possible to shorten the plasma doping time.

A third semiconductor device includes: a first semiconductor region formed on a supporting substrate and having an upper surface and a side surface; a first impurity region of a first conductivity type formed in an upper portion of the first semiconductor region; and a second impurity region of a first conductivity type formed in a side portion of the first semiconductor region, wherein a sheet resistance of the second impurity region is substantially equal to or smaller than that of the first impurity region.

A fourth semiconductor device includes: a first semiconductor region formed on a supporting substrate and having an upper surface and a side surface; a first impurity region of a first conductivity type formed in an upper portion of the first semiconductor region; and a second impurity region of a first conductivity type formed in a side portion of the first semiconductor region, wherein a spreading resistance of the second impurity region is substantially equal to or smaller than that of the first impurity region.

EFFECTS OF THE INVENTION

According to the present invention, it is possible to obtain a semiconductor device including an impurity region in a side portion of a fin-shaped semiconductor region, the impurity region having an implantation dose substantially equal to or greater than that in an upper portion of the fin-shaped semiconductor region. In other words, it is possible to obtain a semiconductor device including an impurity region having a low sheet resistance in a side portion of the fin-shaped semiconductor region. Therefore, it is possible to prevent the degradation in the characteristics of a three-dimensional device such as a fin-shaped FET.

BRIEF DESCRIPTION OF THE DRAWINGS

FIG. 1A to FIG. 1D show a structure of a semiconductor device according to the first embodiment of the present invention, wherein FIG. 1A is a plan view of a portion of a first embodiment of the fin-shaped FET, FIG. 1B is a cross-sectional view along line A-A in FIG. 1A, FIG. 1C is a cross-sectional view along line B-B in FIG. 1A, and FIG. 1D is a cross-sectional view taken along line C-C in FIG. 1A.

FIG. 11A to FIG. 11C show cross-sectional structures of the semiconductor device according to the second variation of the first embodiment of the present invention, wherein FIG. 11A is a cross-sectional view taken along line A-A in FIG. 1A, FIG. 11B is a cross-sectional view taken along line B-B in FIG. 1A, and FIG. 11C is a cross-sectional view taken along line C-C in FIG. 1A.

FIG. 16A to FIG. 16D show a structure of a conventional fin-shaped FET, wherein FIG. 16A is a plan view, FIG. 16B is a cross-sectional view taken along line A-A in FIG. 16A, FIG. 16C is a cross-sectional view taken along line B-B in FIG. 16A, and FIG. 16D is a cross-sectional view taken along line C-C in FIG. 16A.

DETAILED DESCRIPTION OF THE INVENTION

First Embodiment

The structure of a semiconductor device according to a first embodiment of the present invention will now be described with reference to the drawings.

Figure 1A:
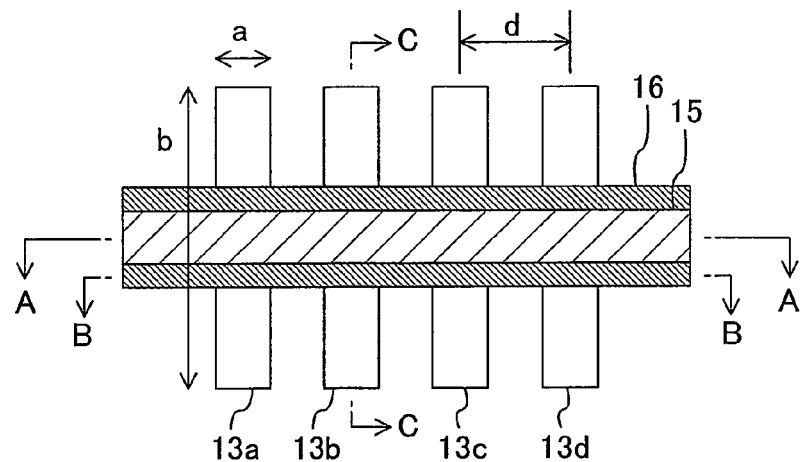
Figure 1B:
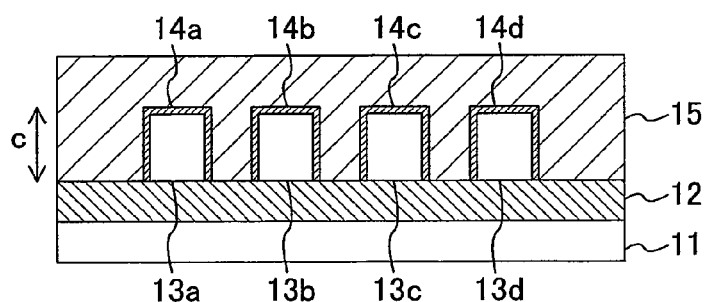
Figure 1C:
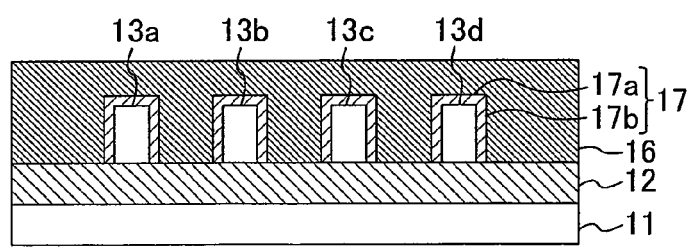
Figure 1D:
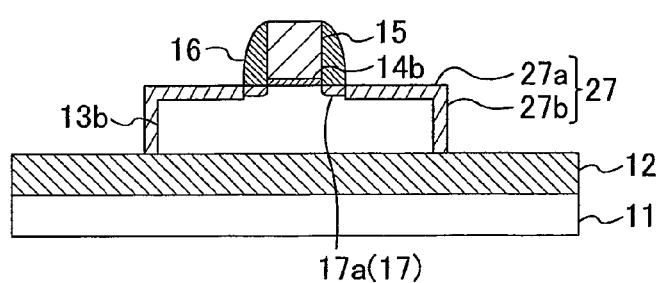

FIG. 1A to FIG. 1D show a structure of a semiconductor device according to the first embodiment of the present invention, i.e., a semiconductor device including a fin-shaped FET, wherein FIG. 1A is a plan view of a portion of the device, FIG. 1B is a cross-sectional view taken along line A-A in FIG. 1A, FIG. 1C is a cross-sectional view taken along line B-B in FIG. 1A, and FIG. 1D is a cross-sectional view taken along line C-C in FIG. 1A.

As shown in FIG. 1A to FIG. 1D, the fin-shaped FET of the present embodiment includes a supporting substrate 11 made of silicon, for example, an insulating layer 12 made of silicon oxide, for example, formed on the supporting substrate 11, fin-shaped semiconductor regions 13a to 13d formed on the insulating layer 12, a gate electrode 15 formed on the fin-shaped semiconductor regions 13a to 13d with gate insulating films 14a to 14d made of a silicon oxynitride film, for example, interposed therebetween, insulative sidewall spacers 16 formed on the side surfaces of the gate electrode 15, extension regions 17 formed in opposing side regions of the fin-shaped semiconductor regions 13a to 13d that are opposing each other with the gate electrode 15 interposed therebetween, and source-drain regions 27 formed in opposing side regions of the fin-shaped semiconductor regions 13a to 13d that are opposing each other with the gate electrode 15 and the insulative sidewall spacers 16 interposed therebetween. The fin-shaped semiconductor regions 13a to 13d each have a width a in the gate width direction of about 30 nm, for example, a width b in the gate length direction of about 200 nm, for example, and a height (thickness) c of about 50 nm, for example, and are arranged with a pitch d (about 60 nm, for example) in the gate width direction on the insulating layer 12. The upper surface and the side surface of the fin-shaped semiconductor regions 13a to 13d may or may not be perpendicular to each other. The gate electrode 15 is formed so as to extend across the fin-shaped semiconductor regions 13a to 13d in the gate width direction. The extension region 17 includes a first impurity region 17a formed in an upper portion of each of the fin-shaped semiconductor regions 13a to 13d, and a second impurity region 17b formed in a side portion of each of the fin-shaped semiconductor regions 13a to 13d. The source-drain region 27 includes a third impurity region 27a formed in an upper portion of each of the fin-shaped semiconductor regions 13a to 13d, and a fourth impurity region 27b formed in a side portion of each of the fin-shaped semiconductor regions 13a to 13d. Note that pocket regions are not described herein or shown in the figure.

The characteristics of the present embodiment are as follows. That is, the implantation dose of the second impurity region 17b formed in the side portion of the fin-shaped semiconductor region is set to be substantially equal to or greater than that of the first impurity region 17a formed in the upper portion of the fin-shaped semiconductor region. Thus, the sheet resistance of the second impurity region 17b of the extension region 17 can be set to be less than or equal to that of the first impurity region 17a, whereby it is possible to obtain desirable transistor characteristics even if the proportion of the width of the second impurity region 17b formed in the side portion of the fin-shaped semiconductor region increases with respect to the width in the gate width direction of the extension region 17. Similarly, the implantation dose of the fourth impurity region 27b formed in the side portion of the fin-shaped semiconductor region is set to be substantially equal to or greater than that of the third impurity region 27a formed in the upper portion of the fin-shaped semiconductor region. Thus, the sheet resistance of the fourth impurity region 27b of the source-drain region 27 can be set to be less than or equal to that of the third impurity region 27a, whereby it is possible to obtain desirable transistor characteristics even if the proportion of the width of the fourth impurity region 27b formed in the side portion of the fin-shaped semiconductor region increases with respect to the width in the gate width direction of the source-drain region 27. Though the sheet resistance of the second impurity region 17b (the fourth impurity region 27b) is set equal to or smaller than that of the first impurity region 17a (the third impurity region 27a) in the above description, the same effects can be obtained even when the resistivity or the spreading resistance of the second impurity region 17b (the fourth impurity region 27b) is set equal to or smaller than the resistivity or the spreading resistance of the first impurity region 17a (the third impurity region 27a). Specifically, $Rs=\rho/t$ is satisfied where Rs is a sheet resistance of a target, $\rho$ is a specific resistance (resistivity), t is a thickness (junction depth), and $\rho w$ is a spreading resistance. Further, proportion of Rs to $\rho w/t$ is lead since the specific resistance (resistivity) $\rho$ and the spreading resistance $\rho w$ are basically in one to one correspondence. In the following description, the term, "sheet resistance" is used mainly, but the "sheet resistance" may be read as "resistivity" or "spreading resistance" in description of the magnitude relationship of the resistance.

Note that in the present embodiment, if the implantation dose of the second impurity region 17b formed in the side portion of the fin-shaped semiconductor region is about 80% (more preferably 90%) or more of that of the first impurity region 17a formed in the upper portion of the fin-shaped semiconductor region, the transistor characteristics can be significantly improved over the conventional techniques. Similarly, if the implantation dose of the fourth impurity region 27b formed in the side portion of the fin-shaped semiconductor region is about 80% (more preferably 90%) or more of that of the third impurity region 27a formed in the upper portion of the fin-shaped semiconductor region, the transistor characteristics can be significantly improved over the conventional techniques.

Moreover, in the present embodiment, if "the height of the side surface of the fin-shaped semiconductor region"/"the width of the upper surface of the fin-shaped semiconductor region in the gate width direction" (hereinafter referred to as the "aspect ratio") is small, there will be little degradation in the transistor characteristics (e.g., drain current) even if the implantation dose of the second impurity region 17b is somewhat smaller than that of the first impurity region 17a, namely, even if the sheet resistance, the resistivity, or the spreading resistance of the second impurity region 17b is somewhat larger (about 10%, for example) than the sheet resistance, the resistivity, or the spreading resistance of the first impurity region 17a. An increase in the aspect ratio accordingly increases the necessity to make the implantation dose of the second impurity region 17b to be substantially equal to or greater than that of the first impurity region 17a, that is, the necessity to set the sheet resistance, the resistivity, or the spreading resistance of the second impurity region 17b to be equal to or smaller than the sheet resistance, the resistivity, or the spreading resistance of the first impurity region 17a. Similarly, if the aspect ratio is small, there will be little degradation in the transistor characteristics even if the implantation dose of the fourth impurity region 27b is somewhat smaller than that of the third impurity region 27a, namely, even if the sheet resistance, the resistivity, or the spreading resistance of the fourth impurity region 27b is somewhat larger (about 10%, for example) than the sheet resistance, the resistivity, or the spreading resistance of the third impurity region 27a. An increase in the aspect ratio accordingly increases the necessity to make the implantation dose of the fourth impurity region 27b to be substantially equal to or greater than that of the third impurity region 27a, that is, the necessity to set the sheet resistance, the resistivity, or the spreading resistance of the fourth impurity region 27b to be equal or smaller than the sheet resistance, the resistivity, or the spreading resistance of the third impurity region 27a.

It is noted that with regard to the above-noted characteristic of drain current, as the amount of the drain current is dependent on the dose in each of the three sides of the Fin-shaped semiconductor region, even if the width of the top region 17a becomes smaller relative to the side regions 17b, a large drain current may be obtained due to the large side regions 17b.

A method for producing a semiconductor device according to the first embodiment of the present invention will now be described with reference to the drawings.

FIG. 2A to FIG. 2E are cross-sectional views showing, step by step, the method for producing a semiconductor device of the first embodiment. Note that FIG. 2A to FIG. 2E correspond to the cross-sectional structure taken along line C-C in FIG. 1A. In FIG. 2A to FIG. 2E, like elements to those shown in FIG. 1A to FIG. 1D are denoted by like reference numerals and will not be described redundantly. It is noted that the thickness and width dimensions set forth in the following examples are approximate values and are intended to be exemplary. As would be understood by those skilled in the art, the various components may have different dimensions.

Figure 2A:
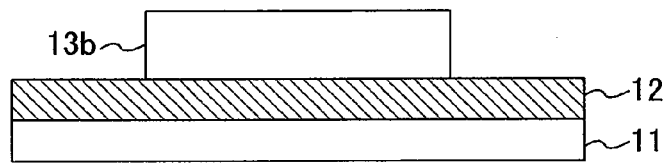
FIG. 2A to FIG. 2E are cross-sectional views showing, step by step, the method for producing a semiconductor device according to the first embodiment of the present invention.

First, as shown in FIG. 2A, there is provided an SOI substrate, in which the insulating layer 12 having a thickness of 150 nm and made of silicon oxide, for example, is provided on the supporting substrate 11 having a thickness of 800 μm and made of silicon, for example, and a semiconductor layer having a thickness of 50 nm and made of silicon, for example, is provided on the insulating layer 12. Then, the semiconductor layer is patterned to form the n-type fin-shaped semiconductor region 13b to be the active region. The fin-shaped semiconductor region 13b has a width a in the gate width direction of about 30 nm, for example, a width b in the gate length direction of about 200 nm, for example, and a height (thickness) c of about 50 nm, for example, and is arranged, with other adjacent fin-shaped semiconductor regions, with a pitch d (about 60 nm, for example) in the gate width direction on the insulating layer 12.

Figure 2B:
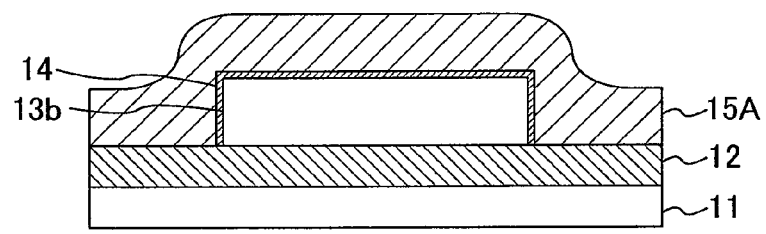

Next, as shown in FIG. 2B, the gate insulating film 14 having a thickness of 3 nm and made of a silicon oxynitride film, for example, is formed on the surface of the fin-shaped semiconductor region 13b, and a polysilicon film 15A having a thickness of 60 nm, for example, is formed across the entire surface of the supporting substrate 11.

Figure 2C:
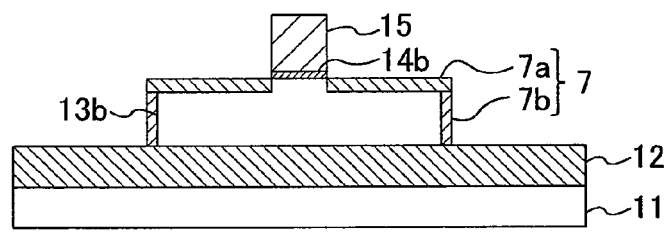

Then, as shown in FIG. 2C, the polysilicon film 15A and the gate insulating film 14 are etched successively to form the gate electrode 15 having a width in the gate length direction of 60 nm, for example, on the fin-shaped semiconductor region 13b with the gate insulating film 14b interposed therebetween. Then, using the gate electrode 15 as a mask, the fin-shaped semiconductor region 13b is doped with a p-type impurity under a first plasma doping condition (the first condition). Thus, there is formed a p-type extension region 7 including a p-type first impurity region 7a formed in the upper portion of the fin-shaped semiconductor region 13b and a p-type second impurity region 7b formed in the side portion of the fin-shaped semiconductor region 13b. The formation is done so that the implantation dose of the first impurity region 7a is greater than that of the second impurity region 7b. Herein, the first plasma doping condition is such that the material gas is $B_2H_6$ (diborane) diluted with He (helium), the $B_2H_6$ concentration in the material gas is 0.05% by mass, the total flow rate of the material gas is 420 cm$^3$/min (standard state), the chamber pressure is 0.9 Pa, the source power (the plasma-generating high-frequency power) is 2000 W, the bias power (the high-frequency power applied to the substrate holder) is 135 W, and the substrate temperature is 20° C.

Figure 2D:
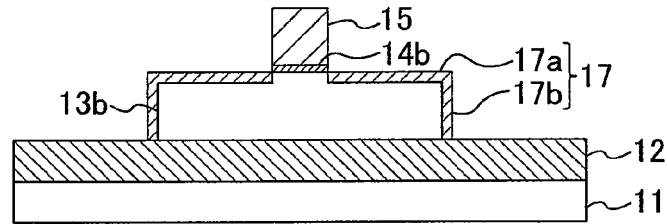

Plasma doping is performed for 120 seconds, for example, under the first plasma doping condition as described above, and then, continuously without turning OFF the discharge, the fin-shaped semiconductor region 13b is doped with a p-type impurity for 680 seconds, for example, under the second plasma doping condition (the second condition). Thus, as shown in FIG. 2D, there is formed a p-type extension region 17 including the p-type first impurity region 17a formed in the upper portion of the fin-shaped semiconductor region 13b and the p-type second impurity region 17b formed in the side portion of the fin-shaped semiconductor region 13b. Thus, the extension region 7 formed in the step shown in FIG. 2C is altered into the extension region 17 in the step shown in FIG. 2D. The formation is done so that the implantation dose of the second impurity region 17b is substantially equal to or greater than that of the first impurity region 17a. Accordingly, the second impurity region 17b can be formed so that the sheet resistance, the resistivity, or the spreading resistance of the second impurity region 17b is equal to or smaller than the sheet resistance, the resistivity, or the spreading resistance of the first impurity region 17a. Herein, the second plasma doping condition is such that the material gas is $B_2H_6$ diluted with He, the $B_2H_6$ concentration in the material gas is 0.02% by mass, the total flow rate of the material gas is 300 cm$^3$/min (standard state), the chamber pressure is 0.9 Pa, the source power is 2000 W, the bias power is 135 W, and the substrate temperature is 20° C. Then, using the gate electrode 15 as a mask, the fin-shaped semiconductor region 13b is ion-implanted with an impurity to form an n-type pocket region (not shown).

Figure 2E:
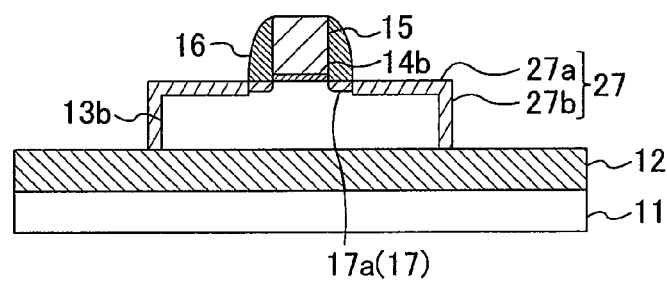

Next, as shown in FIG. 2E, an insulating film having a thickness of 60 nm, for example, is formed across the entire surface of the supporting substrate 11, and then the insulating film is etched back by using anisotropic dry etching to thereby form the insulative sidewall spacer 16 on the side surface of the gate electrode 15. Then, using the gate electrode 15 and the insulative sidewall spacer 16 as a mask, the fin-shaped semiconductor region 13b is doped with a p-type impurity for 120 seconds, for example, under the third plasma doping condition (the third condition), and then, continuously without turning OFF the discharge, the fin-shaped semiconductor region 13b is doped with a p-type impurity for 680 seconds, for example, under the fourth plasma doping condition (the fourth condition). Thus, there is formed the p-type source-drain region 27 including the p-type third impurity region 27a formed in the upper portion of the fin-shaped semiconductor region 13b and the p-type fourth impurity region 27b formed in the side portion of the fin-shaped semiconductor region 13b. When doping under the third plasma doping condition is performed, the third impurity region 27a is formed so that the implantation dose thereof is greater than that of the fourth impurity region 27b. However, by performing doping under the fourth plasma doping condition where the implantation dose is smaller than that of the third plasma doping condition, the source-drain region formed by the third plasma doping condition is altered into the source-drain region 27 by the fourth plasma doping condition. The formation is done so that the implantation dose of the fourth impurity region 27b is substantially equal to or greater than that of the third impurity region 27a. Accordingly, the fourth impurity region 27b can be formed so that the sheet resistance, the resistivity, or the spreading resistance of the fourth impurity region 27b is equal to or smaller than the sheet resistance, the resistivity, or the spreading resistance of the third impurity region 27a. Note that in order to make the implantation dose of the third condition greater than that of the fourth condition, the $B_2H_6$ concentration in the material gas and the total flow rate of the material gas of the third condition are made greater than those of the fourth condition.

The characteristics of the present embodiment are as follows. That is, when the extension region 17 of the fin-shaped FET is formed by using a plasma doping method, the first condition including a relatively large implantation dose and the second condition including a relatively small implantation dose are used. Thus, it is possible to obtain a fin-shaped MISFET including the extension region 17 in which the implantation dose of the second impurity region 17b formed in the side portion of the fin-shaped semiconductor region 13b is substantially equal to or greater than that of the first impurity region 17a formed in the upper portion of the fin-shaped semiconductor region 13b. Therefore, the sheet resistance of the second impurity region 17b can be set to be less than or equal to that of the first impurity region 17a, whereby it is possible to obtain desirable transistor characteristics even if the proportion of the width of the second impurity region 17b formed in the side portion of the fin-shaped semiconductor region increases with respect to the width in the gate width direction of the extension region 17. Similarly, when the source-drain region 27 of the fin-shaped FET is formed by using a plasma doping method, the third condition including a relatively large implantation dose and the fourth condition including a relatively small implantation dose are used. Thus, it is possible to obtain a fin-shaped MISFET including the source-drain region 27 in which the implantation dose of the fourth impurity region 27b formed in the side portion of the fin-shaped semiconductor region 13b is substantially equal to or greater than that of the third impurity region 27a formed in the upper portion of the fin-shaped semiconductor region 13b. Therefore, the sheet resistance of the fourth impurity region 27b can be set to be less than or equal to that of the third impurity region 27a, whereby it is possible to obtain desirable transistor characteristics even if the proportion of the width of the fourth impurity region 27b formed in the side portion of the fin-shaped semiconductor region increases with respect to the width in the gate width direction of the source-drain region 27.

In the present embodiment, the n-type fin-shaped semiconductor region 13b is plasma-doped with a p-type impurity to form the p-type extension region 17 and the p-type source-drain region 27, i.e., a p-type MISFET. Alternatively, a p-type fin-shaped semiconductor region may be doped with an n-type impurity to form an n-type extension region and an n-type source-drain region, i.e., an n-type MISFET.

Moreover, in the present embodiment, in order to realize a larger implantation dose for the first condition (the third condition), the $B_2H_6$ concentration in the material gas and the total flow rate of the material gas of the first condition (the third condition) are set to be greater than those of the second condition (the fourth condition). Alternatively, only one of these two of the first condition (the third condition) may be set to be greater than that of the second condition (the fourth condition). Moreover, it is understood that other parameters such as the chamber pressure, the source power or the bias power may be controlled so as to realize a larger implantation dose for the first condition (the third condition).

Moreover, in the present embodiment, in order to reduce the sheet resistance of the second impurity region 17b, it is preferred that the junction depth of the second impurity region 17b is set to be substantially equal to or greater than the junction depth of the first impurity region 17a. Such a configuration can be realized by, for example, performing appropriate annealing after performing plasma doping so that the implantation dose of the second impurity region 17b formed in the side portion of the fin-shaped semiconductor region is greater than that of the first impurity region 17a formed in the upper portion of the fin-shaped semiconductor region. Similarly, in order to reduce the sheet resistance of the fourth impurity region 27b, it is preferred that the junction depth of the fourth impurity region 27b is set to be substantially equal to or greater than that of the third impurity region 27a. Such a configuration can be realized by, for example, performing appropriate annealing after performing plasma doping so that the implantation dose of the fourth impurity region 27b formed in the side portion of the fin-shaped semiconductor region is greater than that of the third impurity region 27a formed in the upper portion of the fin-shaped semiconductor region.

While $B_2H_6$ diluted with He is used as the material gas of plasma doping in the present embodiment, the material gas is not limited to any particular gas as long as the gas contains the impurity to be implanted into the fin-shaped semiconductor regions. Instead of $B_2H_6$, one may employ, for example, other molecules containing boron atoms (e.g., $BF_3$), other molecules composed of boron atoms and hydrogen atoms, or $AsH_3$ or $PH_3$, or the like. A gas containing an impurity may or may not be diluted with a rare gas such as He. Note that where $B_2H_6$ diluted with He is used as the material gas of plasma doping as in the present embodiment, it is preferred that the concentration by mass of $B_2H_6$ in the material gas is greater than or equal to 0.01% and less than or equal to 1%. Then, it is possible to easily introduce boron into the fin-shaped semiconductor regions. If the $B_2H_6$ gas concentration is less than 0.01%, it is difficult to introduce a sufficient amount of boron, and if the $B_2H_6$ gas concentration is greater than 1%, a boron-containing deposit is likely to deposit on the substrate surface.

The mechanism of the present invention will now be described, using the extension region 17 as an example, with reference to the drawings, separately for the upper portion and the side portion of the fin-shaped semiconductor regions.

(Mechanism Of Present Invention)

Figure 3A:
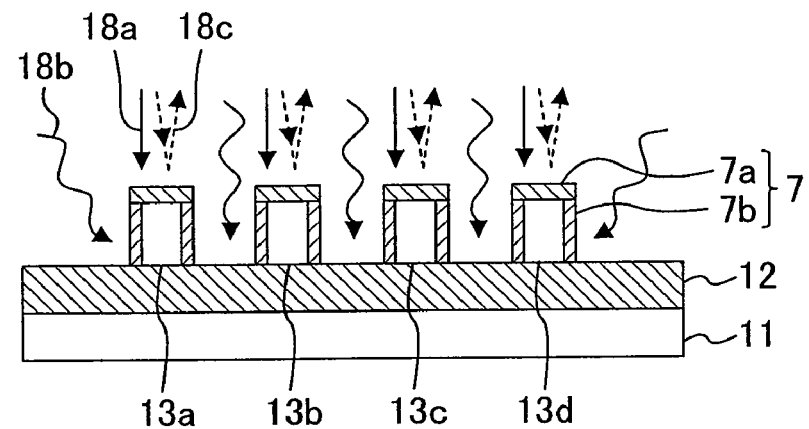
FIG. 3A is a cross-sectional view illustrating a method for doping under the first plasma doping condition shown in FIG. 2C.
Figure 3B:
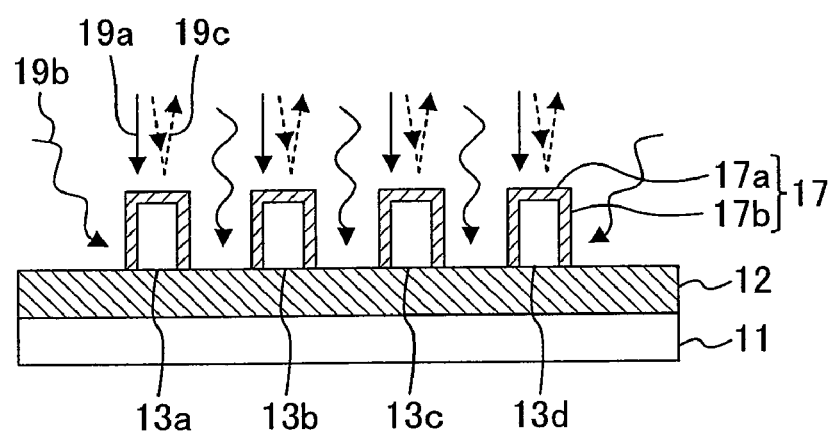
FIG. 3B is a cross-sectional view illustrating a method for doping under the second plasma doping condition shown in FIG. 2D.

FIG. 3A is a cross-sectional view of an important part, illustrating a method for doping under the first plasma doping condition shown in FIG. 2C, and FIG. 3B is a cross-sectional view of an important part, illustrating a method for doping under the second plasma doping condition shown in FIG. 2D. Note that FIG. 3A and FIG. 3B correspond to the cross-sectional structure (before the formation of the insulative sidewall spacer 16) taken along line B-B in FIG. 1A. In FIG. 3A and FIG. 3B, like elements to those shown in FIG. 1A to FIG. 1D are denoted by like reference numerals and will not be described redundantly.

Figure 4:
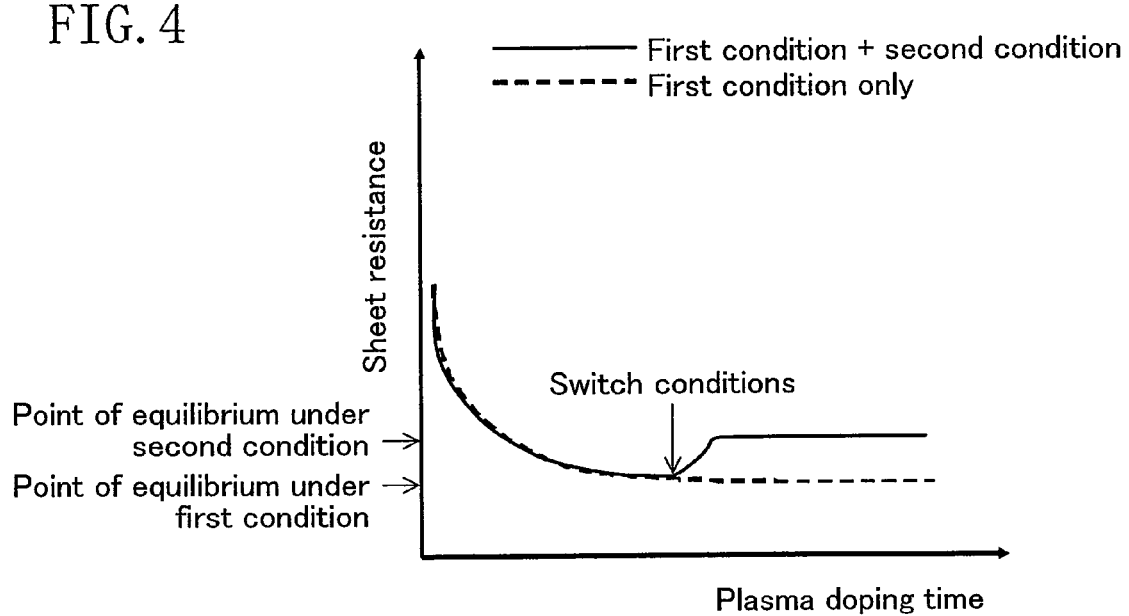
FIG. 4 shows the relationship between the sheet resistance and the plasma doping time for the first impurity region formed in the upper portion of the fin-shaped semiconductor region in the method for producing a semiconductor device according to the first embodiment of the present invention.

FIG. 4 shows the relationship between the sheet resistance and the plasma doping time for the first impurity region formed in the upper portion of the fin-shaped semiconductor region.

Figure 5:
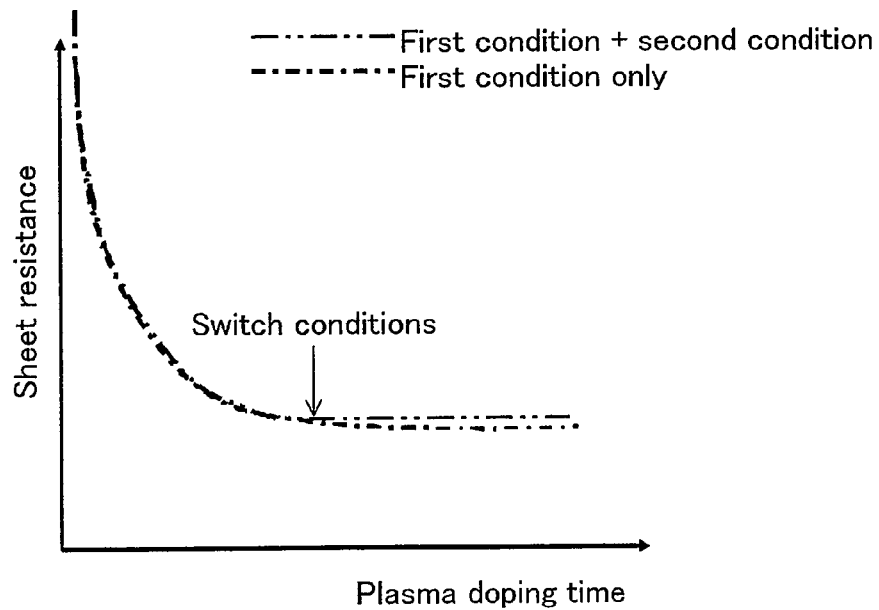
FIG. 5 shows the relationship between the sheet resistance and the plasma doping time for the second impurity region formed in the side portion of the fin-shaped semiconductor region in the method for producing a semiconductor device according to the first embodiment of the present invention.

FIG. 5 shows the relationship between the sheet resistance and the plasma doping time for the second impurity region formed in the side portion of the fin-shaped semiconductor region.

Figure 6:
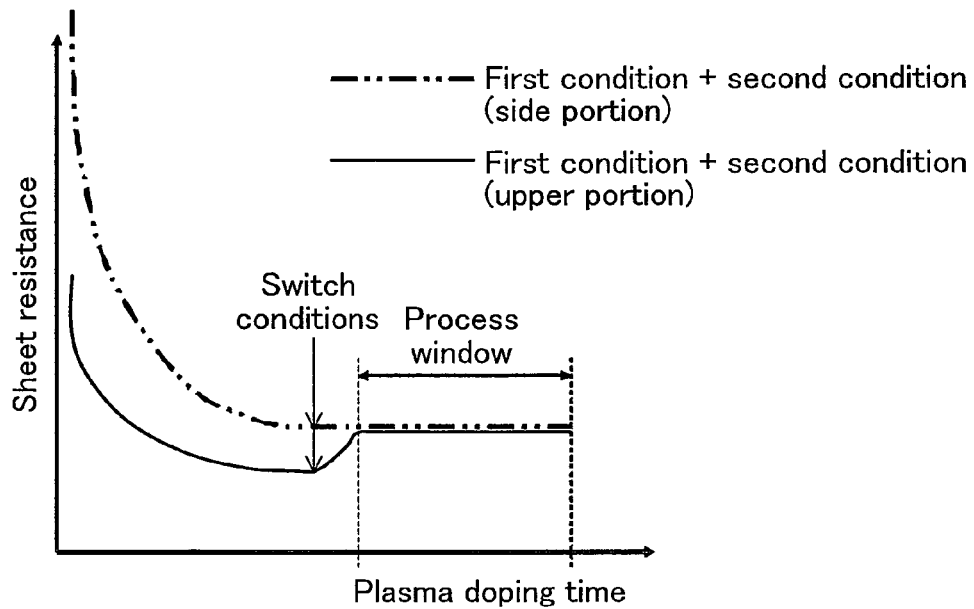
FIG. 6 shows the relationship between the sheet resistance and the plasma doping time for each of the first impurity region formed in the upper portion of the fin-shaped semiconductor region and the second impurity region formed in the side portion of the fin-shaped semiconductor region in the method for producing a semiconductor device according to the first embodiment of the present invention.

FIG. 6 shows the relationship between the sheet resistance and the plasma doping time for each of the first impurity region formed in the upper portion of the fin-shaped semiconductor region and the second impurity region formed in the side portion of the fin-shaped semiconductor region.

Note that the sheet resistance shown in FIG. 4 to FIG. 6 (this applies also to FIG. 7 to FIG. 9 to be discussed later) is obtained by performing RTA (rapid thermal annealing) for 20 seconds at a temperature of 1075° C. after plasma doping. By performing sufficient annealing after doping, it is possible to realize a one-to-one correspondence between the implantation dose and the sheet resistance.

(Mechanism Of Present Invention For Upper Portion Of Fin-Shaped Semiconductor Region)

First, as shown in FIG. 3A, the fin-shaped semiconductor regions 13a to 13d are doped with a p-type impurity under the first plasma doping condition (the first condition). Thus, the first impurity region 7a is formed in the upper portion of the fin-shaped semiconductor regions 13a to 13d, wherein the implantation dose of the first impurity region 7a is dictated by the balance between implanted ions 18a, an adsorbed species (a neutral species such as gas molecules or radicals) 18b, and an impurity 18c that is desorbed from the fin-shaped semiconductor regions 13a to 13d by sputtering.

As indicated by the broken line in FIG. 4, where the plasma doping time with only the first condition is elongated, the amount of impurity introduction by the implanted ions 18a and the adsorbed species 18b introduced into the semiconductor regions 13a to 13d is greater than the amount of the impurity 18c desorbed from the fin-shaped semiconductor regions 13a to 13d by sputtering, whereby the sheet resistance of the first impurity region 7a decreases monotonously, in an initial stage of plasma doping. Then, as the amount of impurity introduction per unit time into the semiconductor regions 13a to 13d decreases gradually, the degree of decrease in the sheet resistance of the first impurity region 7a also starts becoming more gentle, and the degree of decrease eventually becomes very gentle. This is because the amount of increase in the amount of impurity introduction per unit time decreases gradually as the amount of impurity introduced by the implanted ions 18a and the adsorbed species 18b and the amount of impurity desorbed by sputtering come to an equilibrium. Therefore, where an impurity is introduced only under the first condition, the final sheet resistance of the first impurity region 7a is the sheet resistance corresponding to the dose implanted into the first impurity region 7a by the time when the amount of impurity introduction and the amount of impurity desorption come to an equilibrium under the first condition (the "point of equilibrium under first condition" in FIG. 4) (i.e., the sheet resistance at the "point of equilibrium under first condition" in FIG. 4).

Then, as shown in FIG. 3B, following the plasma doping under the first condition, the fin-shaped semiconductor regions 13a to 13d are doped with a p-type impurity after switching to the second plasma doping condition (the second condition) where the gas concentration is lower than that of the first condition. Thus, the first impurity region 17a is formed in the upper portion of the fin-shaped semiconductor regions 13a to 13d, wherein the implantation dose of the first impurity region 17a is dictated by the balance between implanted ions 19a, an adsorbed species (a neutral species such as gas molecules or radicals) 19b, and an impurity 19c that is desorbed from the fin-shaped semiconductor regions 13a to 13d by sputtering. Thus, the first impurity region 7a shown in FIG. 3A is altered into the first impurity region 17a as shown in FIG. 3B. Since the gas concentration of the second condition is lower than that of the first condition, the implantation dose of the first impurity region 17a decreases from that of the initially-formed first impurity region 7a. In other words, the sheet resistance of the first impurity region 17a becomes higher than that of the first impurity region 7a.

As indicated by the solid line in FIG. 4, after the condition is switched to the second condition where the gas concentration is lower than that of the first condition during a plasma doping process, the phenomenon that the impurity is desorbed from the fin-shaped semiconductor regions by sputtering becomes more pronounced under the second condition as compared with the first condition. Therefore, a portion of the impurity having been introduced into the fin-shaped semiconductor region by the plasma doping under the first condition that is in excess of the level of the dose implanted by the time when the amount of impurity introduction and the amount of impurity desorption come to an equilibrium under the second condition (i.e., the dose corresponding to the sheet resistance at the "point of equilibrium under second condition" in FIG. 4) is desorbed from the fin-shaped semiconductor regions by sputtering when performing the plasma doping under the second condition. In other words, when the condition is switched from the first condition to the second condition during a plasma doping process, the dose to be eventually introduced into the fin-shaped semiconductor regions is equal to a dose dictated by the balance between the amount of impurity introduced by the implanted ions and the adsorbed species and the amount of impurity desorbed by sputtering under the second condition, whereby the implantation dose decreases and the sheet resistance increases and becomes stable at the increased level. Specifically, the balance between the amount of impurity introduction and the amount of impurity desorption in plasma doping is dependent only on the doping condition at the final stage (the second condition in the present embodiment), but not on the preceding conditions (the first condition in the present embodiment). Thus, the sheet resistance of the first impurity region is at the level at which the sheet resistance eventually becomes stable under the second condition (the sheet resistance at the "point of equilibrium under second condition" in FIG. 4).

As described above, the difference between the case where plasma doping is performed only with the first condition (the broken line in FIG. 4) and the case where plasma doping is performed with the first condition and the second condition (the solid line in FIG. 4) corresponds to the difference between the sheet resistance dictated by the balance between the amount of impurity introduction and the amount of impurity desorption under the first condition and the sheet resistance dictated by the balance between the amount of impurity introduction and the amount of impurity desorption under the second condition. Thus, when plasma doping is performed only with the first condition, the sheet resistance becomes stable at a level that is dictated by the balance between the amount of impurity introduction and the amount of impurity desorption under the first condition, whereas when plasma doping is performed during which the condition is switched from the first condition to the second condition, the sheet resistance becomes stable at a level that is dictated by the balance between the amount of impurity introduction and the amount of impurity desorption under the second condition. The difference between the sheet resistance with the first condition and that with the second condition is due to the difference therebetween in the influence of doping and sputtering.

(Mechanism Of Present Invention For Side Portion Of Fin-Shaped Semiconductor Region)

First, as shown in FIG. 3A, the fin-shaped semiconductor regions 13a to 13d are doped with a p-type impurity under the first plasma doping condition (the first condition). Thus, the second impurity region 7b is formed in the side portion of the fin-shaped semiconductor regions 13a to 13d, wherein the implantation dose of the second impurity region 7b is dictated primarily by the adsorbed species (a neutral species such as gas molecules or radicals) 18b. In this process, since there are ions that are incident on the side surface of the fin-shaped semiconductor regions 13a to 13d from an inclined direction, there are present the implanted ions 18a and the impurity 18c that is desorbed from the fin-shaped semiconductor regions 13a to 13d by sputtering, but nevertheless the influence thereof is very little as compared with the adsorbed species 18b and doping by the adsorbed species 18b will be dominant. Specifically, the number of the implanted ions 18a doped into the side portion of the fin-shaped semiconductor regions 13a to 13d and the impurity 18c desorbed from the side portion of the fin-shaped semiconductor regions 13a to 13d by sputtering is very small as compared with the number of the implanted ions 18a doped into the upper portion of the fin-shaped semiconductor regions 13a to 13d and the impurity 18c desorbed from the upper portion of the fin-shaped semiconductor regions 13a to 13d by sputtering.

As indicated by the one-dot chain line in FIG. 5, where the plasma doping time with only the first condition is elongated, the sheet resistance of the second impurity region 7b decreases monotonously in an initial stage of plasma doping. Then, as the amount of impurity introduction per unit time into the semiconductor regions 13a to 13d decreases gradually, the degree of decrease in the sheet resistance of the second impurity region 7b also starts becoming more gentle, and the degree of decrease eventually becomes very gentle. This is because the amount of increase in the amount of impurity introduction per unit time decreases gradually as the amount of impurity introduced by the implanted ions 18a and the adsorbed species 18b and the amount of impurity desorbed by sputtering come to an equilibrium. However, since the dose of the implanted ions 18a doped into the side portion of the fin-shaped semiconductor regions 13a to 13d is smaller than the dose of the implanted ions 18a doped into the upper portion of the fm-shaped semiconductor regions 13a to 13d, the sheet resistance of the second impurity region 7b becomes stable at a higher level than the sheet resistance of the first impurity region 7a.

Then, as shown in FIG. 3B, following the plasma doping under the first condition, the fin-shaped semiconductor regions 13a to 13d are doped with a p-type impurity after switching to the second plasma doping condition (the second condition) where the gas concentration is lower than that of the first condition. Thus, the second impurity region 17b is formed in the side portion of the fin-shaped semiconductor regions 13a to 13d. In this process, since the amount of the impurity 19c that is desorbed from the side portion of the fin-shaped semiconductor regions 13a to 13d by sputtering is small, the implantation dose of the second impurity region 17b does not change or decrease only slightly from that of the second impurity region 7b.

Therefore, as indicated by the two-dot chain line in FIG. 5, even if the condition is switched to the second condition where the gas concentration is lower than that of the first condition during the plasma doping process, the sheet resistance of the second impurity region 17b will be a value close to the sheet resistance immediately before switching to the second condition, i.e., the sheet resistance dictated by the first condition.

As described above, there is little decrease in the implantation dose by sputtering in the side portion of the fin-shaped semiconductor regions 13a to 13d, whereby the difference between the sheet resistance obtained when plasma doping is performed with only the first condition (the one-dot chain line in FIG. 5) and that obtained when plasma doping is performed with the first condition and the second condition (the two-dot chain line in FIG. 5) is substantially none or very little if at all.

(Comparison Of Mechanism Of Present Invention Between Upper Portion And Side Portion Of Fin-Shaped Semiconductor Region)

Referring now to FIG. 6, the results of plasma doping performed by using the second condition with a lower gas concentration, following plasma doping using the first condition, for the upper portion of the fin-shaped semiconductor region and those for the side portion of the fin-shaped semiconductor region will be described together. Note that in FIG. 6, the solid line is that in FIG. 4, and the two-dot chain line is that in FIG. 5.

As indicated by the solid line in FIG. 6, the influence of sputtering during plasma doping in the first impurity region (the upper portion of the semiconductor region) is greater than that in the second impurity region (the side portion of the semiconductor region), whereby when the condition is switched from the first condition to the second condition, a portion of the impurity introduced in excess of the implantation dose corresponding to the level of the sheet resistance dictated by the second condition is pushed out of the semiconductor region by sputtering when performing plasma doping under the second condition. Therefore, the level at which the dose introduced by ion implantation and adsorption of the neutral species (such as gas molecules or radicals) and the amount of impurity desorbed from the semiconductor region by sputtering come to an equilibrium depends only on the final one of a plurality of plasma doping conditions used, but not on the preceding plasma doping conditions. Therefore, the value of the sheet resistance in the first impurity region (the upper portion of the semiconductor region) is at the level at which the sheet resistance eventually becomes stable under the second condition.

On the other hand, as indicated by the two-dot chain line in FIG. 6, the influence of sputtering during plasma doping in the second impurity region (the side portion of the semiconductor region) is smaller than that in the first impurity region (the upper portion of the semiconductor region), whereby even when the condition is switched from the first condition to the second condition, the dose introduced under the first condition will not be decreased at all or only slightly if at all by sputtering under the second condition. Therefore, the value of the sheet resistance in the second impurity region (the side portion of the semiconductor region) will be a value close to the sheet resistance immediately before switching to the second condition, i.e., the sheet resistance dictated by the first condition.

Thus, by performing plasma doping while switching the condition from the first condition where the implantation dose is relatively large to the second condition where the implantation dose is relatively small, the implantation dose in the first impurity region (the upper portion of the semiconductor region) and that in the second impurity region (the side portion of the semiconductor region) can be made equal to each other with a very high precision. Moreover, it is possible to make the implantation dose in the second impurity region (the side portion of the semiconductor region) larger than that in the first impurity region (the upper portion of the semiconductor region). FIG. 6 shows a process window in which the implantation dose of the first impurity region (the upper portion of the semiconductor region) and that in the second impurity region (the side portion of the semiconductor region) can be made equal to each other.

Note that also in the formation of the source-drain region 27, the implantation dose in the third impurity region (the upper portion of the semiconductor region) 27a and that in the fourth impurity region (the side portion of the semiconductor region) 27b can be made equal to each other by using a mechanism similar to that for the formation of the extension region 17. Moreover, it is possible to make the implantation dose in the fourth impurity region (the side portion of the semiconductor region) 27b larger than that in the third impurity region (the upper portion of the semiconductor region) 27a.

Specific examples will be used below to illustrate how the value of the sheet resistance in the first impurity region (the upper portion of the semiconductor region) will be at the level at which the sheet resistance eventually becomes stable under the second condition.

FIRST EXAMPLE

First, the first example will be described with reference to FIG. 7. Curve A in FIG. 7 corresponds to the case where plasma doping is performed only with the first condition as described above with respect to FIG. 4, wherein the plasma doping condition is such that, for example, the material gas is $B_2H_6$ diluted with He, the $B_2H_6$ concentration in the material gas is 0.05% by mass, the total flow rate of the material gas is 420 cm$^3$/min (standard state), the chamber pressure is 0.9 Pa, the source power (plasma-generating high-frequency power) is 2000 W, the bias power (the high-frequency power applied to the substrate holder) is 135 W, and the substrate temperature is 20° C. Curve B in FIG. 7 corresponds to the case where plasma doping is performed with only the second condition as described above with respect to FIG. 4, wherein the plasma doping condition is such that, for example, the material gas is $B_2H_6$ diluted with He, the $B_2H_6$ concentration in the material gas is 0.02% by mass, the total flow rate of the material gas is 300 cm$^3$/min (standard state), the chamber pressure is 0.9 Pa, the source power (plasma-generating high-frequency power) is 2000 W, the bias power (the high-frequency power applied to the substrate holder) is 135 W, and the substrate temperature is 20° C.

Note that in the first example, in order to lower the sheet resistance in the second impurity region (the side portion of the semiconductor region) dictated by the first condition, the $B_2H_6$ concentration and the total flow rate of the first condition are set to 0.05% by mass and 420 cm$^3$/min (standard state), respectively, which are greater than those of the second condition.

Moreover, in the first example, the timing at which the condition is switched from the first condition to the second condition is set to be 120 seconds after the start of the plasma doping.

Figure 7:
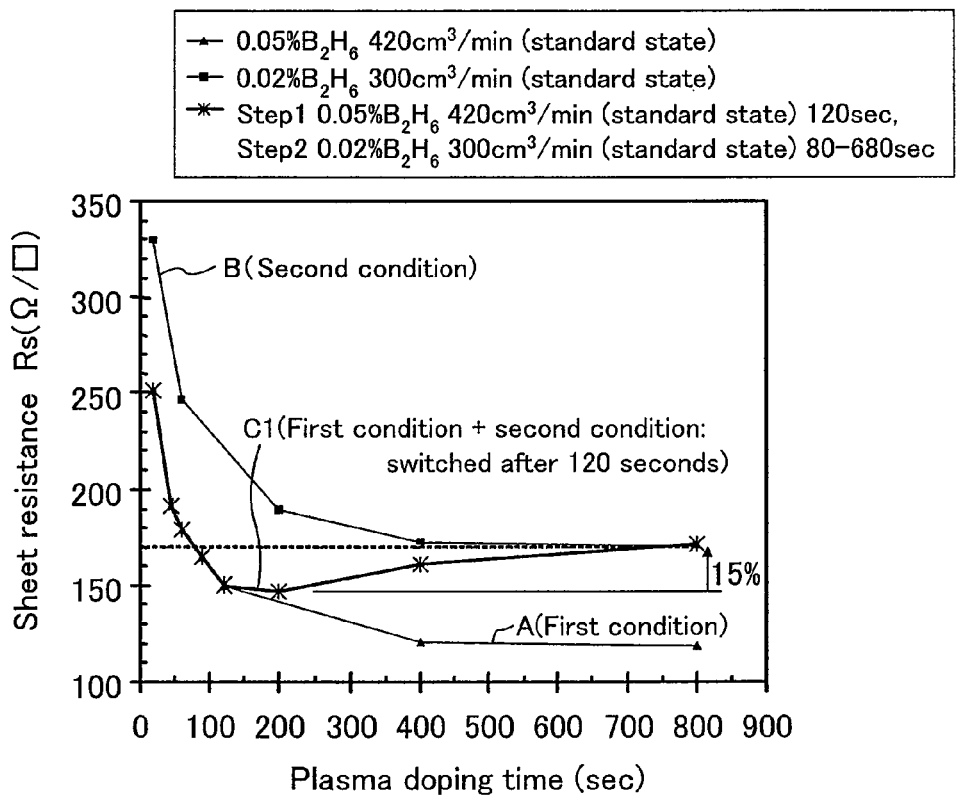
FIG. 7 shows the relationship between the sheet resistance and the plasma doping time for the first impurity region formed in the upper portion of the fin-shaped semiconductor region in the first example of the method for producing a semiconductor device according to the first embodiment of the present invention.

Curve C1 in FIG. 7 shows the change in the sheet resistance of the first impurity region (the upper portion of the semiconductor region) obtained when using the first condition from the start of plasma doping until 120 seconds later, and then, continuously without turning OFF the plasma-generating discharge, performing plasma doping under the second condition (i.e., the change in the sheet resistance of the first example). As indicated by Curve C1 in FIG. 7, it can be seen that the sheet resistance monotonously decreases after the start of plasma doping until about 200 seconds later, after which the gradient turns from negative to positive, and the sheet resistance is clearly increasing from about 200 seconds from the start of the plasma doping until about 800 seconds from the start.

Note that in the first example, the smallest value of the sheet resistance at 200 seconds after the start of the plasma doping is 147 Ω/□, and the increased sheet resistance value at about 800 seconds after the start of the plasma doping is 171 Ω/□, the difference therebetween being 24 Ω/□. The amount of increase in the sheet resistance is about 15% of the sheet resistance value (170 Ω/□) at which the sheet resistance eventually becomes stable when doping with only the second condition. It should be noted here that the sheet resistance value 171 Ω/□ at about 800 seconds after the start of the plasma doping in the first example is very close to the sheet resistance value (170 Ω/□) at which the sheet resistance eventually becomes stable when doping with only the second condition. It is believed that this means self-alignment to be described below. That is, it has been confirmed that where the timing at which the condition is switched from the first condition to the second condition is set to be relatively late, i.e., 120 seconds after the start of the plasma doping, even if the sheet resistance is intentionally lowered to be smaller than the target value (170 Ω/□ in the present example), the final sheet resistance value increases in a self-aligned manner to the sheet resistance value (170 Ω/□ in the present example) dictated by the second condition, being the latter plasma doping condition. This is a very special phenomenon unique to the present invention. Note that the timing at which the condition is switched from the first condition to the second condition is set to be substantially later in the first example in order to clearly illustrate this phenomenon, and it is preferred that the condition is switched from the first condition to the second condition at a timing such that the sheet resistance of the second impurity region (the side portion of the semiconductor region) dictated by the first condition (the level of the minimum value before the condition is switched to the second condition) takes a desirable value.

SECOND EXAMPLE

Next, the second example will be described with reference to FIG. 8.

In the first example, the timing at which the condition is switched from the first condition to the second condition is set to be 120 seconds after the start of the plasma doping. In the second example, the timing is changed so that the condition is switched from the first condition to the second condition 60 seconds after the start of the plasma doping. Note that the plasma doping condition of the first condition and that of the second condition are the same as those of the first example, and Curve A and Curve B in FIG. 8 are the same as Curve A and Curve B in FIG. 7.

Figure 8:
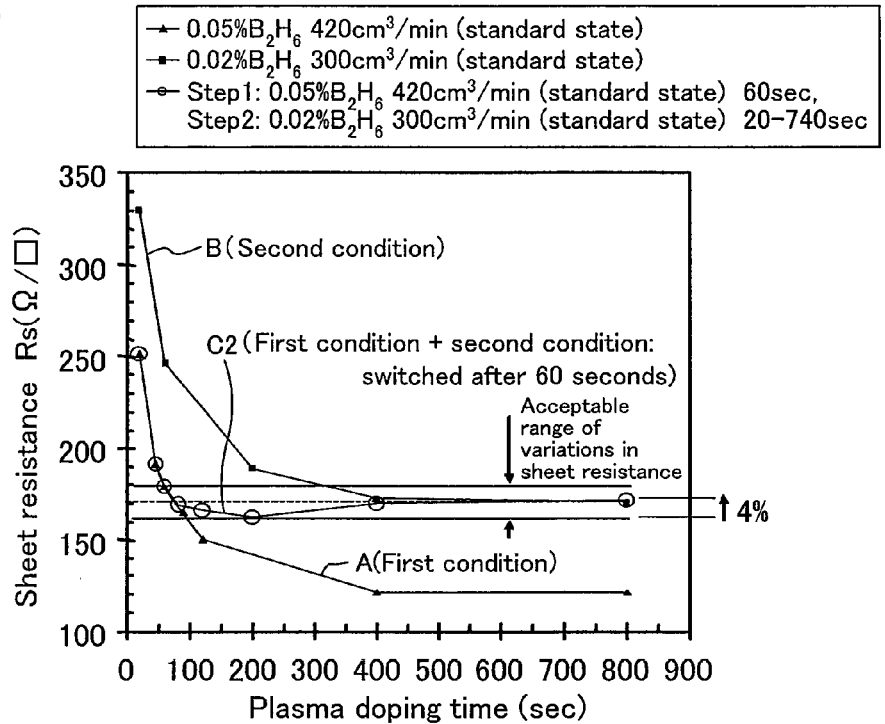
FIG. 8 shows the relationship between the sheet resistance and the plasma doping time for the first impurity region formed in the upper portion of the fin-shaped semiconductor region in the second example of the method for producing a semiconductor device according to the first embodiment of the present invention.

Curve C2 in FIG. 8 shows the change in the sheet resistance of the first impurity region (the upper portion of the semiconductor region) obtained when using the first condition from the start of plasma doping until 60 seconds later, and then, continuously without turning OFF the plasma-generating discharge, performing plasma doping under the second condition (i.e., the change in the sheet resistance of the second example). It should be noted that also in the second example, as in the first example, the transition of the sheet resistance shows a tendency that disproves the common knowledge of conventional plasma doping, as indicated by Curve C2 in FIG. 8.

Specifically, in the conventional plasma doping, the sheet resistance monotonously decreases over time. This is believed to be as follows. While the doping dose increases as ions from plasma are implanted, as the adsorption of radicals, gas molecules, etc., advances, and as the adsorbed radicals, gas molecules, etc., are struck by ions from above so as to be pushed into the semiconductor region, the implantation dose increases as the plasma doping time increases based on these phenomena. Of course the amount of increase in the dose per unit time may vary depending on the plasma doping condition, and the amount of increase in the dose per unit time may gradually decrease as the influence of doping and the influence of sputtering come to an equilibrium, but it is nevertheless in the nature of conventional plasma doping that the implantation dose necessarily increases as the plasma doping time increases.

In contrast, in the second example, although the sheet resistance monotonously decreases as in ordinary plasma doping until 200 seconds after the start of the plasma doping, the gradient of the change in the sheet resistance turns from negative to positive at about 200 seconds after the start of the plasma doping. Then, surprisingly, after 200 seconds since the start of the plasma doping, the sheet resistance started increasing toward the sheet resistance value (170 $\Omega/\square$) at which the sheet resistance eventually becomes stable when doping with only the second condition. Then, after the sheet resistance reached the sheet resistance value (170 $\Omega/\square$) at which the sheet resistance eventually becomes stable when doping with only the second condition at about 400 seconds after the start of the plasma doping, the rate of increase in the sheet resistance decreased. Specifically, the sheet resistance at 200 seconds after the start of the plasma doping is 163 $\Omega/\square$, that at 400 seconds after the start of the plasma doping is 170 $\Omega/\square$, and that at 800 seconds after the start of the plasma doping is 172 $\Omega/\square$. It appears from these results that the increase in the sheet resistance from 200 seconds to 400 seconds after the start of the plasma doping is the action of a natural mechanism aiming at the sheet resistance value (170 $\Omega/\square$) at which the sheet resistance eventually becomes stable when doping with only the second condition. Moreover, as shown in FIG. 8, when obtaining the target sheet resistance value (170 $\Omega/\square$ (including the tolerance range)), it is possible to further shorten the plasma doping time by doping with the second condition after doping with the first condition, as compared with a case where the doping is performed with only the second condition (Curve B).

Note that in FIG. 8, the increase to the target value (170 $\Omega/\square$ in the present example) from the sheet resistance, 163 $\Omega/\square$, at about 200 seconds after the start of the plasma doping when the sheet resistance is at the lowest level is about 4% of the target value. This is smaller than the amount of increase of about 15% shown in the first example. Thus, there is an effect that it is possible to control the amount of increase from the sheet resistance value at the lowest level to the sheet resistance to the target value (e.g., 170 $\Omega/\square$ in the present example), by adjusting the timing at which the condition is switched from the first condition to the second condition. Thus, by controlling the timing is it possible to suppress/minimize the deviation between the target sheet resistance and the lowest sheet resistance value.

THIRD EXAMPLE

Next, the third example will be described with reference to FIG. 9.

In the second example, the timing at which the condition is switched from the first condition to the second condition is set to be 60 seconds after the start of the plasma doping. In the third example, the timing is changed so that the condition is switched from the first condition to the second condition 20 seconds after the start of the plasma doping. Note that the plasma doping condition of the first condition and that of the second condition are the same as those of the first example, and Curve A and Curve B in FIG. 9 are the same as Curve A and Curve B in FIG. 7.

Figure 9:
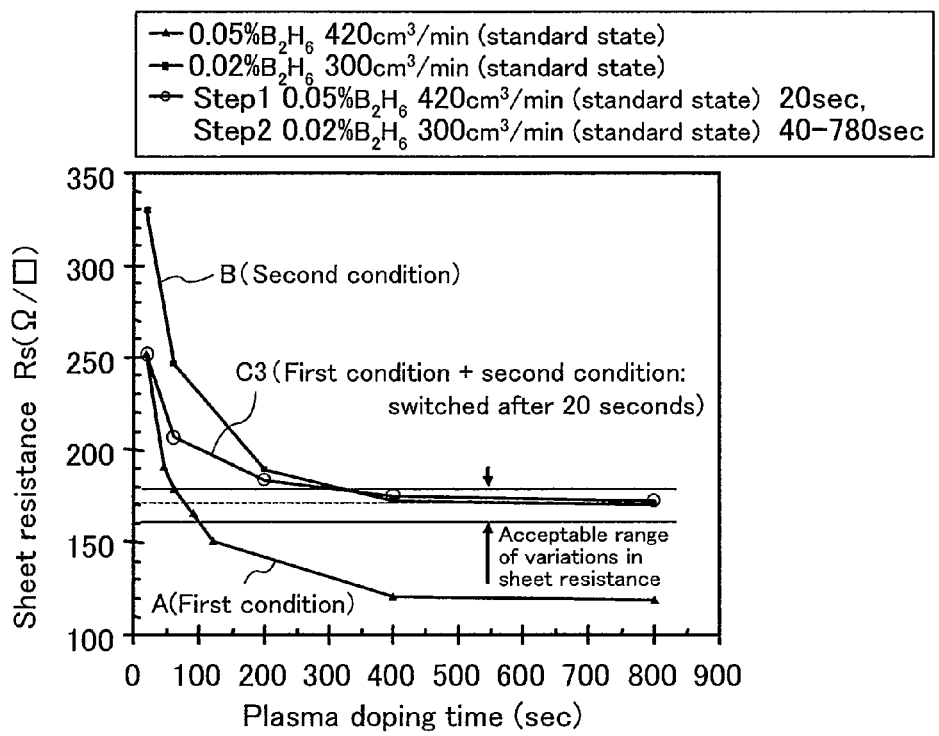
FIG. 9 shows the relationship between the sheet resistance and the plasma doping time for the first impurity region formed in the upper portion of the fin-shaped semiconductor region in the third example of the method for producing a semiconductor device according to the first embodiment of the present invention.

Curve C3 in FIG. 9 shows the change in the sheet resistance obtained when using the first condition from the start of plasma doping until 20 seconds later, and then, continuously without turning OFF the plasma-generating discharge, performing plasma doping under the second condition (i.e., the change in the sheet resistance of the third example). As indicated by Curve C3 in FIG. 9, also in the third example where the timing at which the condition is switched from the first condition to the second condition is set to be 20 seconds after the start of the plasma doping, the sheet resistance value at which the sheet resistance becomes stable between 400 seconds and 800 seconds after the start of the plasma doping was within a tolerance range of, though slightly higher than, the sheet resistance value (170 $\Omega/\square$) at which the sheet resistance eventually becomes stable when doping with only the second condition.

As can be seen from the first to third examples described above, the level of the implantation dose, i.e., the sheet resistance, which is determined as the influence of doping and the influence of sputtering come to an equilibrium on the semiconductor region upper surface when plasma doping is performed using different conditions, depends only on the plasma doping condition at the final stage but not on conditions at intermediate stages. Specifically, an impurity that has once been introduced into a semiconductor region can go out of the semiconductor region under conditions such that the sputtering is dominant.

First Variation Of First Embodiment

A structure of a semiconductor device according to a first variation of the first embodiment of the present invention will now be described with reference to the drawings.

Figure 10:
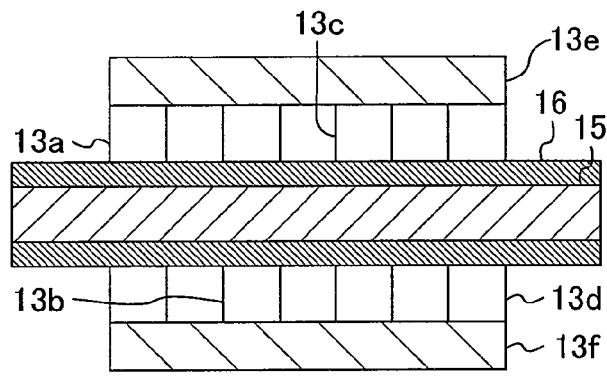
FIG. 10 is a plan view of a portion of a fin-shaped FET according to a first variation of the first embodiment of the present invention.

FIG. 10 is a plan view of a semiconductor device of this variation, specifically, a semiconductor device including a fin-shaped FET. Note that in FIG. 10, like elements to those of the first embodiment shown in FIG. 1A to FIG. 1D are denoted by like reference numerals.

As shown in FIG. 10, this variation differs from the first embodiment shown in FIG. 1A to FIG. 1D in that other fin-shaped semiconductor regions 13e and 13f connect together end portions of the fin-shaped semiconductor regions 13a to 13d on each side of the fin-shaped semiconductor regions 13a to 13d in the gate length direction.

According to this variation, it is possible to form a single fm-shaped FET with the fin-shaped semiconductor regions 13a to 13f, while obtaining effects similar to those of the first embodiment.

Second Variation Of First Embodiment

A structure of a semiconductor device according to a second variation of the first embodiment of the present invention will now be described with reference to the drawings.

Figure 11A:
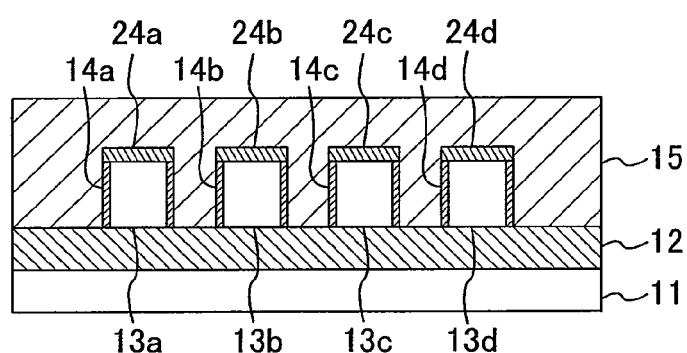

A plan view showing a structure of a semiconductor device of this variation, specifically, a semiconductor device including a fin-shaped FET, is the same as FIG. 1A being a plan view of the first embodiment. FIG. 11A to FIG. 1C show cross-sectional structures of the semiconductor device of this variation, wherein FIG. 11A is a cross-sectional view taken along line A-A in FIG. 1A, FIG. 11B is a cross-sectional view taken along line B-B in FIG. 1A, and FIG. 11C is a cross-sectional view taken along line C-C in FIG. 1A.

Figure 11B:
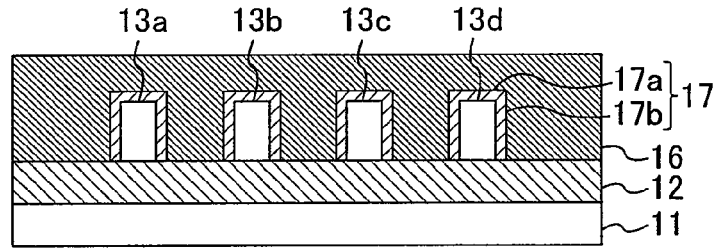
Figure 11C:
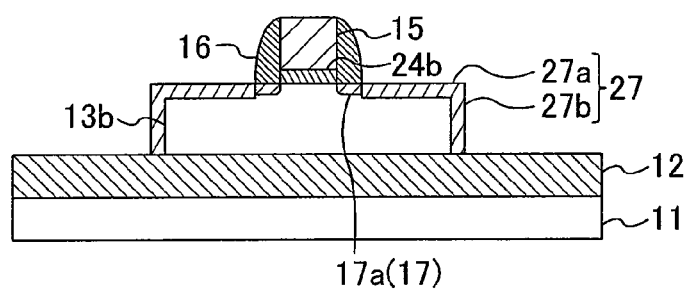

As shown in FIG. 11A to FIG. 11C, this variation differs from the first embodiment shown in FIG. 1A to FIG. 1D as follows. Specifically, in the first embodiment, the gate insulating films 14a to 14d having a thickness of about 3 nm and made of a silicon oxynitride film, for example, are formed on the upper surface and the side surface of the fin-shaped semiconductor regions 13a to 13d. In contrast, in this variation, the gate insulating films 14a to 14d are formed only on the side surface of the fin-shaped semiconductor regions 13a to 13d, and insulating films 24a to 24d having a thickness of 20 nm and made of a silicon oxide film, for example, are formed on the upper surface of the fin-shaped semiconductor regions 13a to 13d.

Thus, in this variation, only the side portion of the fin-shaped semiconductor regions 13a to 13d is used as a channel region. Also with such a structure, it is possible to obtain effects similar to those of the first embodiment if the aspect ratio ("the height of the side surface of the fin-shaped semiconductor region"/"the width of the upper surface of the fin-shaped semiconductor region in the gate width direction") is large.

Second Embodiment

A method for producing a semiconductor device according to a second embodiment of the present invention, specifically, a method for determining the first and second plasma doping conditions in the method for producing a semiconductor device of the first embodiment described above, will now be described with reference to the drawings.

Figure 12:
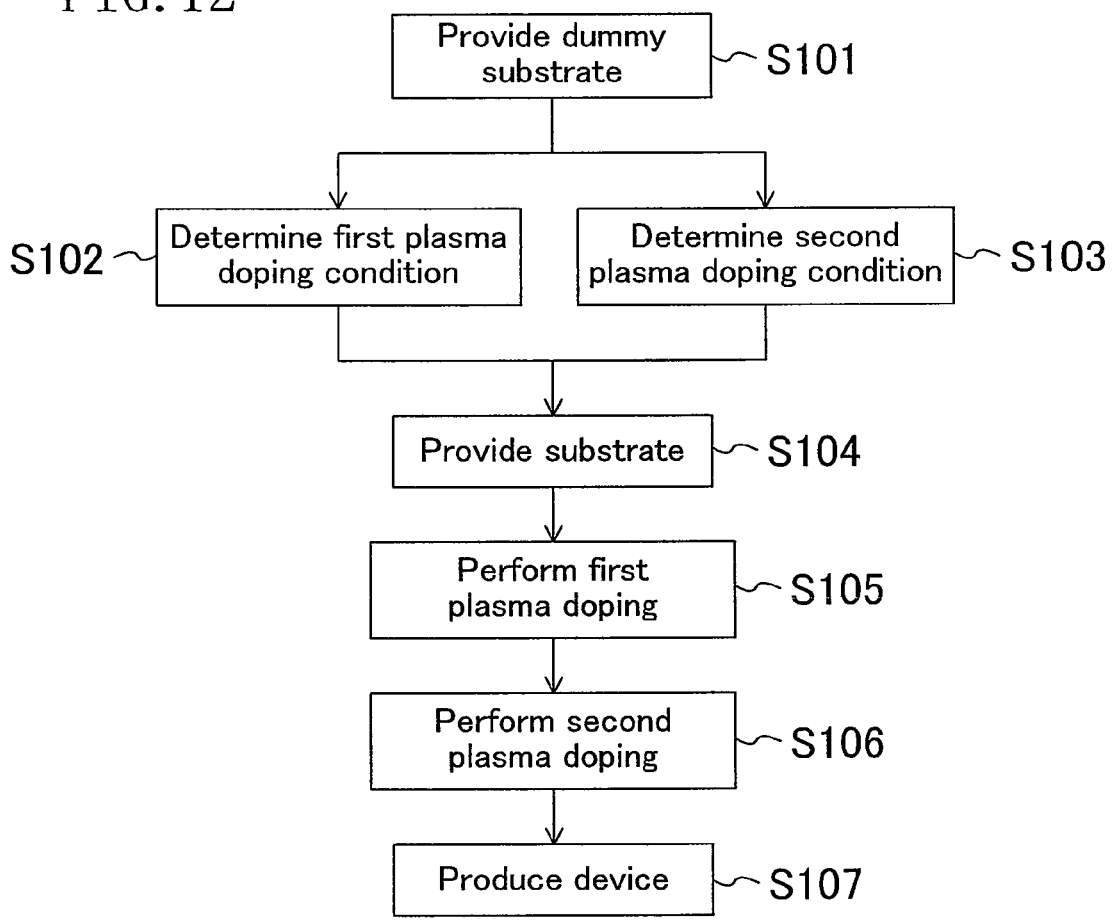
FIG. 12 is a flow chart showing the method for determining the plasma doping condition in the method for producing a semiconductor device according to a second embodiment of the present invention.
Figure 13A:
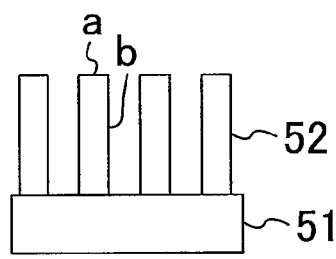
FIG. 13A shows a schematic cross-sectional structure of a dummy substrate used in the method for determining the plasma doping condition in the method for producing a semiconductor device according to the second embodiment of the present invention.
Figure 13B:
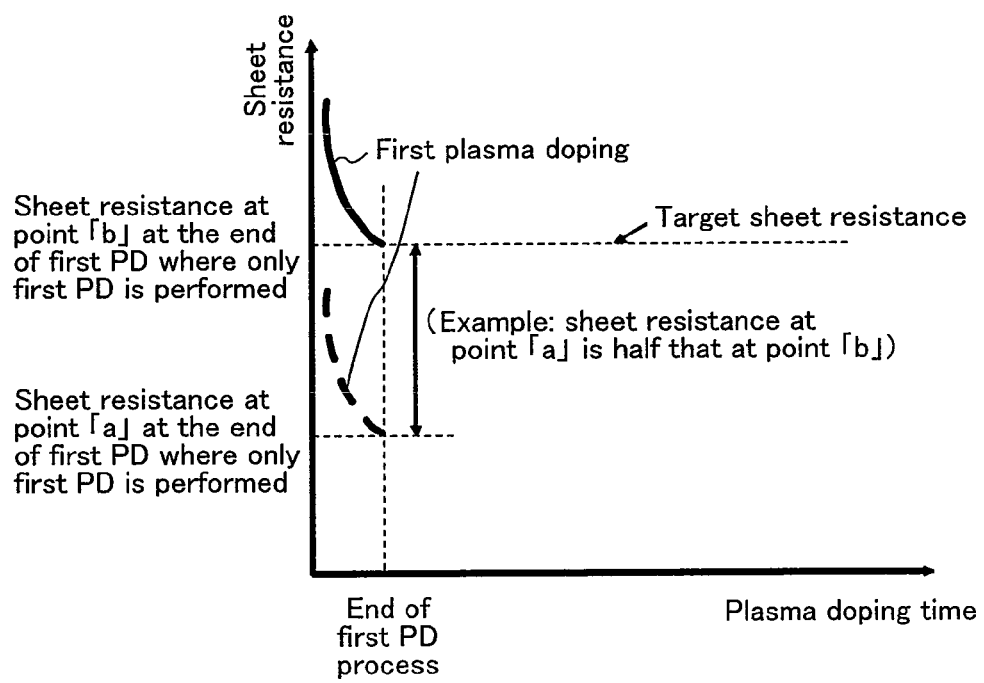
FIG. 13B shows the relationship between the plasma doping time in step S102 in FIG. 12 and the sheet resistance.
Figure 14:
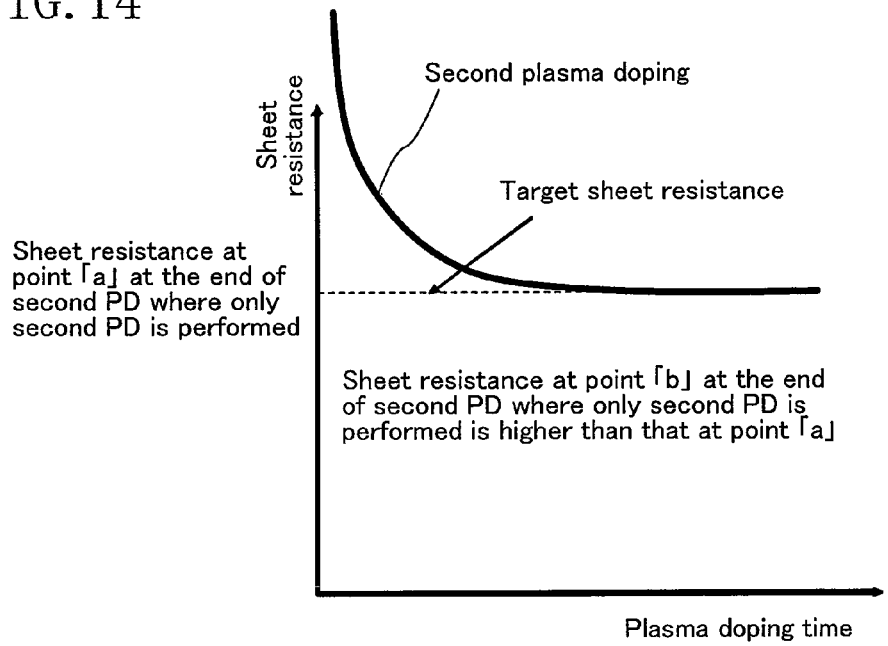
FIG. 14 shows the relationship between the plasma doping time in step S103 in FIG. 12 and the sheet resistance.
Figure 15:
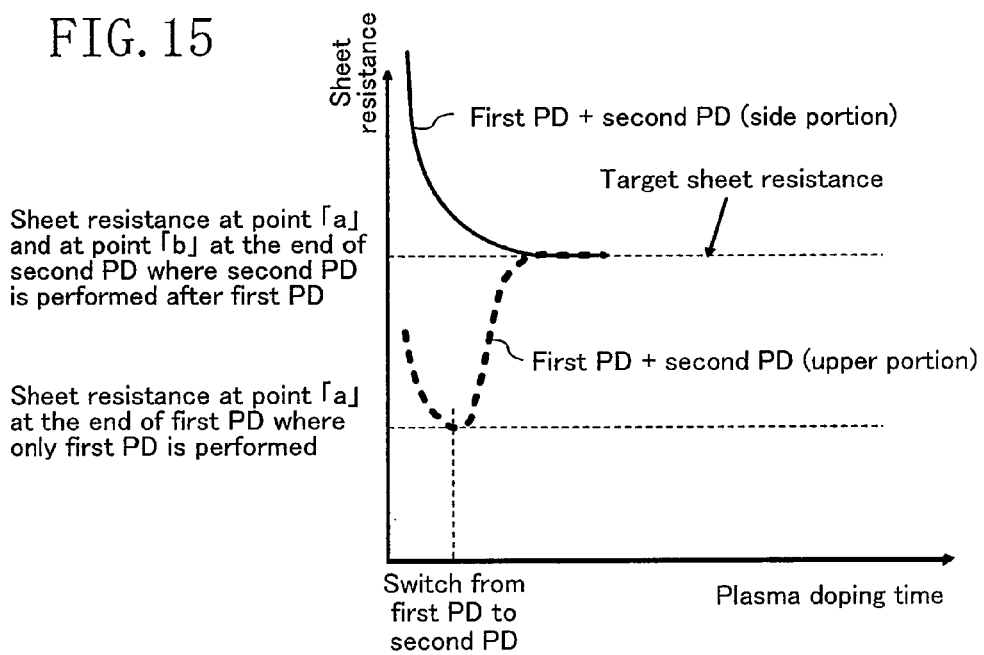
FIG. 15 shows the relationship between the plasma doping time in steps S105 and S106 in FIG. 12 and the sheet resistance.
Figure 16A:
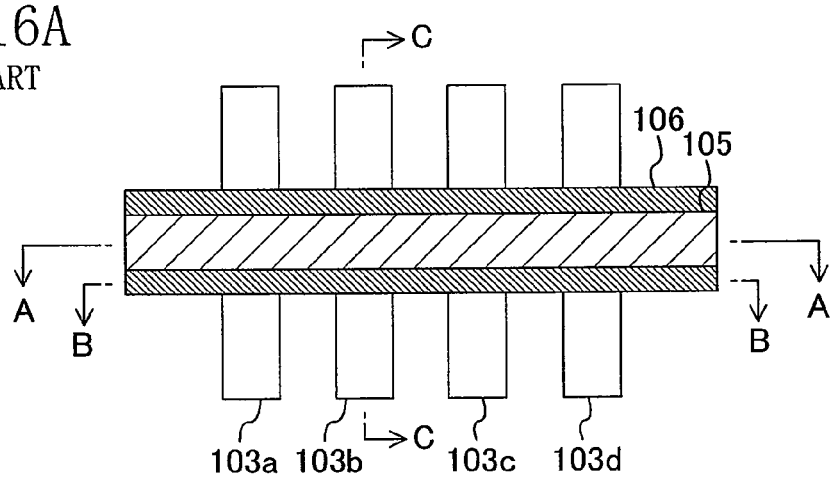
Figure 16B:
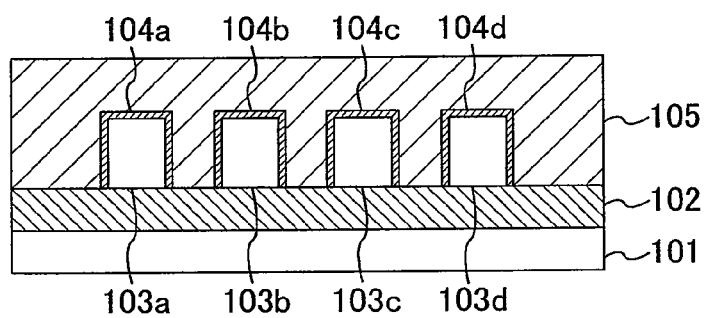
Figure 16C:
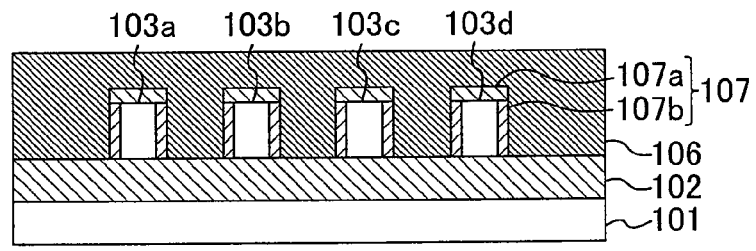
Figure 16D:
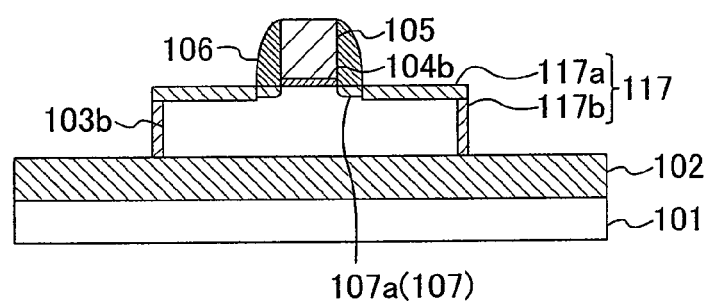
Figure 17A:
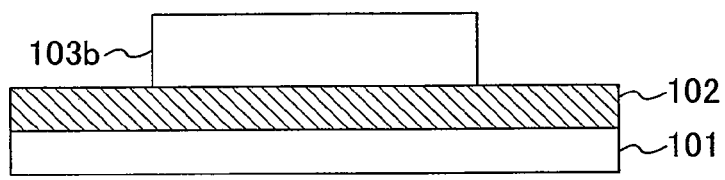
FIG. 17A to FIG. 17D are cross-sectional views o showing, step by step, a conventional method for producing a semiconductor device.
Figure 17B:
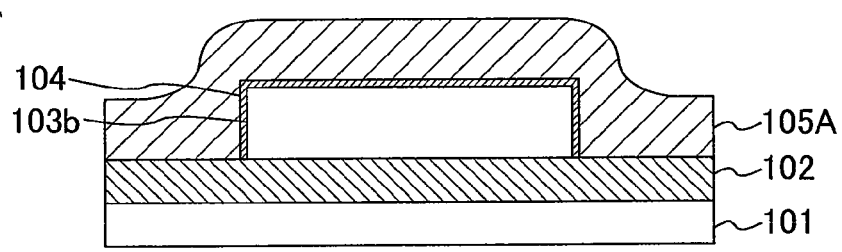
Figure 17C:
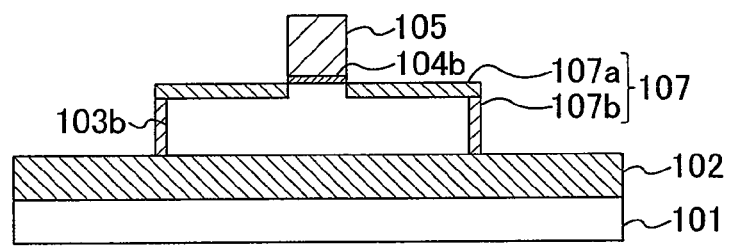
Figure 17D:
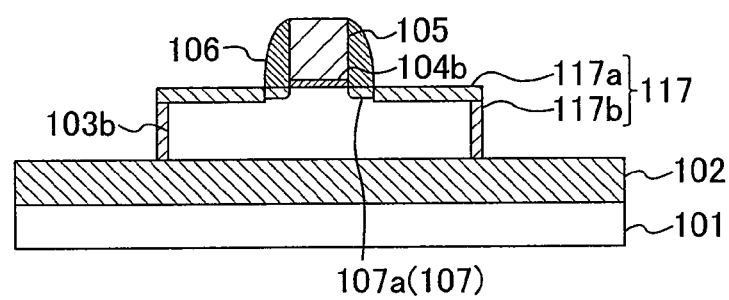
Figure 18A:
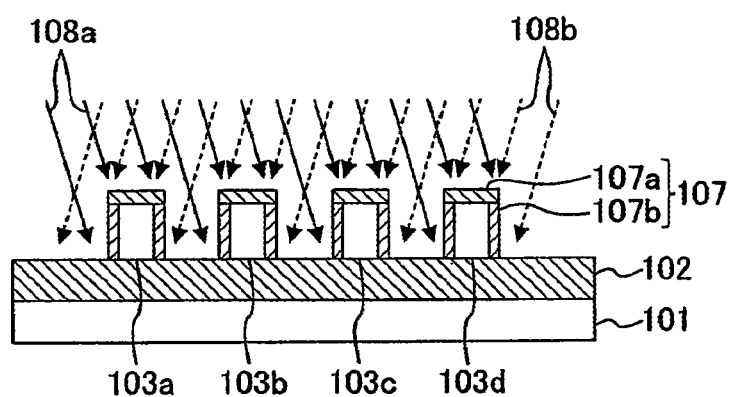
FIG. 18A is a cross-sectional view showing the step of forming a source-drain region of a fin-shaped FET as described in Patent Document 1.
Figure 18B:
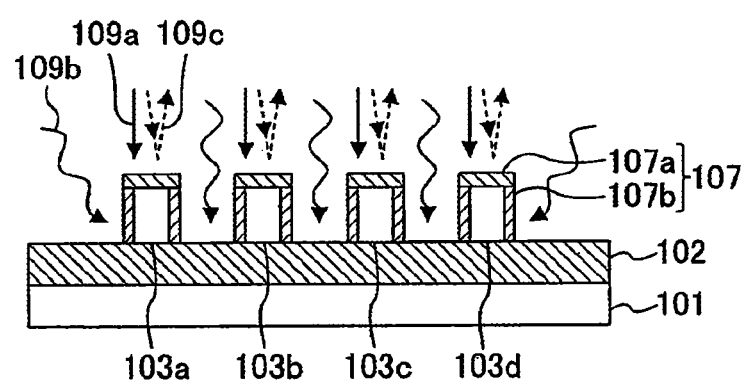
FIG. 18B is a cross-sectional view showing the step of forming a source-drain region of a fin-shaped FET as described in Non-Patent Document 1.

FIG. 12 is a flow chart showing the method for determining the plasma doping condition of the present embodiment. FIG. 13A shows a schematic cross-sectional structure of a dummy substrate used in the method for determining the plasma doping condition of the present embodiment, and FIG. 13B shows the relationship between the plasma doping time in step S102 and the sheet resistance. FIG. 14 shows the relationship between the plasma doping time in step S103 and the sheet resistance. FIG. 15 shows the relationship between the plasma doping time in steps S105 and S106 and the sheet resistance.

First, in step S101, a plurality of identical dummy substrates 51 are provided as dummy substrates for use in setting the plasma doping conditions, and fin-shaped semiconductor regions (hereinafter referred to as "fins") 52 having the same specifications (or substantially the same specifications) as those of a device to be produced, e.g., fins 52 similar to the fin-shaped semiconductor regions 13a to 13d of the first embodiment shown in FIG. 1A to FIG. 1D, are formed on each dummy substrate 51, as shown in FIG. 13A. As shown in FIG. 13A, each fin 52 includes a first surface parallel to the principle plane of the substrate (on which the point a is the sheet resistance measurement point) and a second surface perpendicular to the principle plane of the substrate (on which the point b is the sheet resistance measurement point).

Then, in step S102, the fins 52 are plasma-doped with a p-type impurity under various conditions by using the plurality of dummy substrates 51 with the fins 52 formed thereon (hereinafter referred to as the "first PD"). Then, after a heat treatment for activating the implanted impurity is performed, the sheet resistance at the point a of the fins 52 and that at the point b of the fins 52 are measured. Then, those conditions under which the sheet resistance at the point b takes a desirable value are determined to be the "first PD conditions". FIG. 13B shows how the sheet resistance at the point b takes a desirable value in step S102. At this point, the sheet resistance at the point a is half of that at the point b, for example.

Note that where the sheet resistance at the point b is different from a desirable value, step S102 is repeated while changing the plasma doping conditions using an unprocessed dummy substrate 51 with the fins 52 formed thereon until the sheet resistance at the point b is equal to the desirable value. When there is no longer an unprocessed dummy substrate 51 with the fins 52 formed hereon, step S101 and step S102 are repeated.

Then, in step S103, the fins 52 are plasma-doped with a p-type impurity under various conditions by using a plurality of unprocessed dummy substrate 51 with the fins 52 formed thereon (hereinafter referred to as the "second PD"). Then, after a heat treatment for activating the implanted impurity is performed, the sheet resistance at the point a of the fins 52 and that at the point b of the fins 52 are measured. Then, those conditions under which the sheet resistance at the point a takes a desirable value are determined to be the "second PD conditions". FIG. 14 shows how the sheet resistance at the point a takes a desirable value in step S103. At this point, the sheet resistance at the point b is higher than that at the point a.

Note that where the sheet resistance at the point a is different from a desirable value, step S103 is repeated while changing the plasma doping conditions using an unprocessed dummy substrate 51 with the fins 52 formed thereon until the sheet resistance at the point a is equal to the desirable value. When there is no longer an unprocessed dummy substrate 51 with the fins 52 formed hereon, step S101 and step S103 are repeated.

Then, in step S104, there is formed a substrate for producing a device that has been subjected to steps up to immediately before the PD process, e.g., a substrate having a structure of the first embodiment as shown in FIG. 2C. The substrate has been subjected to the formation of the fins and preliminary steps (e.g., washing) before the PD process.

Then, in step S105, the substrate for producing a device is subjected to plasma doping using the first PD conditions determined in step S102 (conditions under which the sheet resistance at the point b takes a desirable value).

Then, in step S106, the substrate for producing a device is subjected to plasma doping using the second PD conditions determined in step S103 (conditions under which the sheet resistance at the point a takes a desirable value). In this process, step S106 may be performed in the same chamber as in step S105 and continuously thereafter without turning OFF the discharge. FIG. 15 shows how the sheet resistance in the upper portion (the point a) of the fins and that in the side portion (the point b) of the fins take desirable values in steps S105 and S106. Note that FIG. 15 shows a case where the sheet resistance in the upper portion (the point a) of the fins and that in the side portion (the point b) of the fins are set to the same value.

Finally, in step S107, steps after the PD process, e.g., washing, resist peeling, heat treatment for activation, etc., are performed to complete the device production.

As described above, according to the present embodiment, it is possible to reliably produce a semiconductor device having a structure of the first embodiment, i.e., a semiconductor device including fin-shaped semiconductor regions and being capable of exerting desirable characteristics.

INDUSTRIAL APPLICABILITY

The present invention relates to a semiconductor device and a method for producing the same, and more particularly is useful in realizing a semiconductor device of a three-dimensional structure including fin-shaped semiconductor regions on a substrate with which desirable characteristics can be obtained.

What is claimed is:
1. A method for producing a semiconductor device, comprising:
a step (a) of forming on a supporting substrate a first semiconductor region having an upper surface and a side surface; and a step (b) of implanting the first semiconductor region with an impurity of a first conductivity type by a plasma doping method to thereby form a first impurity region in an upper portion of the first semiconductor region and a second impurity region in a side portion of the first semiconductor region, wherein in the step (b), a plasma doping method is carried out under a first condition such that an implantation dose is equal to a first dose, and then a plasma doping method is carried out under a second condition such that the implantation dose is equal to a second dose smaller than the first dose, said method further comprising, before the step (b), a step of implanting a semiconductor region which is similar to the first semiconductor region and is provided in each of a plurality of dummy substrates with the impurity by a plasma doping method under various conditions, so as to identify, as the first condition, a condition under which a sheet resistance of an impurity region formed in a side portion of the semiconductor region takes an intended value, and so as to identify, as the second condition, a condition under which a sheet resistance of an impurity region formed in an upper portion of the semiconductor region takes an intended value.

2. The method for producing a semiconductor device of claim 1, wherein:
the step (b) is performed by using a plasma generated from a gas containing the impurity; and
a concentration of the gas under the first condition is higher than that of the gas under the second condition.

3. The method for producing a semiconductor device of claim 1, wherein after the step (b), an implantation dose of the second impurity region is substantially equal to or greater than an implantation dose of the first impurity region.

4. The method for producing a semiconductor device of claim 1, further comprising, before the step (a), a step of forming an insulating layer on the supporting substrate,
wherein the first semiconductor region is formed on the insulating layer in the step (a).

5. The method for producing a semiconductor device of claim 1, wherein the side surface of the first semiconductor region is a surface perpendicular to the upper surface of the first semiconductor region.

6. The method for producing a semiconductor device of claim 1, wherein in the first impurity region, an implantation dose at a point in time when the plasma doping method is carried out under the second condition is decreased from that at a point in time when the plasma doping method is carried out under the first condition.

7. The method for producing a semiconductor device of claim 1, wherein:
the step (b) is performed by using a plasma generated from a gas containing the impurity; and
the gas containing the impurity contains molecules $B_mH_n$ (m and n are natural numbers) composed of boron atoms and hydrogen atoms.

8. The method for producing a semiconductor device of claim 1, wherein:
the step (b) is performed by using a plasma generated from a gas containing the impurity; and
the gas containing the impurity is a gas obtained by diluting molecules including boron atoms with a rare gas.

9. The method for producing a semiconductor device of claim 1, wherein:
the step (b) is performed by using a plasma generated from a gas containing the impurity; and
a gas containing the impurity is a gas obtained by diluting molecules including the impurity with helium.

10. The method for producing a semiconductor device of claim 1, wherein:
the step (b) is performed by using a plasma generated from a gas containing the impurity; and
the gas containing the impurity is a mixed gas of $B_2H_6$ and He.

11. The method for producing a semiconductor device of claim 10, wherein a concentration by mass of $B_2H_6$ in the mixed gas is greater than or equal to 0.01% and less than or equal to 1%.

12. The method for producing a semiconductor device of claim 1, wherein:
the step (b) is performed by using a plasma generated from a gas containing the impurity; and
the gas containing the impurity contains $BF_3$, $AsH_3$ or $PH_3$.

* * * * *